(12) United States Patent
Sugimoto

(10) Patent No.: US 7,741,016 B2
(45) Date of Patent: Jun. 22, 2010

(54) METHOD FOR FABRICATING SEMICONDUCTOR DEVICE AND EXPOSURE MASK

(75) Inventor: Fumitoshi Sugimoto, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 819 days.

(21) Appl. No.: 11/593,527

(22) Filed: Nov. 7, 2006

(65) Prior Publication Data
US 2008/0020329 A1    Jan. 24, 2008

(30) Foreign Application Priority Data
Jul. 18, 2006    (JP) .............................. 2006-195434

(51) Int. Cl.
*G03F 7/00*    (2006.01)

(52) U.S. Cl. .................... 430/313; 430/312; 430/5; 430/394

(58) Field of Classification Search .............. 430/5, 430/311–314, 394; 438/700
See application file for complete search history.

(56) References Cited

U.S. PATENT DOCUMENTS 6,153,357 A * 11/2000 Okamoto et al. ............ 430/312
6,303,272 B1 * 10/2001 Furukawa et al. ........... 430/314
6,492,073 B1 * 12/2002 Lin et al. ....................... 430/5

FOREIGN PATENT DOCUMENTS

| JP | 10-92714 A | 4/1998 |
| JP | 10-289861 A | 10/1998 |
| JP | 2001-356465 A | 12/2001 |
| JP | 2002-250999 A | 9/2002 |

* cited by examiner

*Primary Examiner*—Mark F Huff
*Assistant Examiner*—Stewart A Fraser
(74) *Attorney, Agent, or Firm*—Westerman, Hattori, Daniels & Adrian, LLP

(57) ABSTRACT

The method for fabricating the semiconductor device includes the step of forming a photoresist film 84 over a substrate 10, the step of exposing interconnection patterns to the photoresist film 84, the step of exposing to the photoresist film 84 hole patterns of a plurality of holes positioned at ends or bent portions of the interconnection patterns where holes to be connected to the interconnection patterns are to be formed, and the step of developing the photoresist film 84 with the interconnection patterns and the holes patterns exposed to. Thus, the insufficient exposure energy at the ends or the bent portions of the patterns due to optical proximity effect is compensated to prevent the shortening at the pattern ends or the rounding at the pattern bent portions. The contacts with the contact plugs connected to the pattern ends or the pattern bent portions can be ensured.

7 Claims, 23 Drawing Sheets

FIG. 17
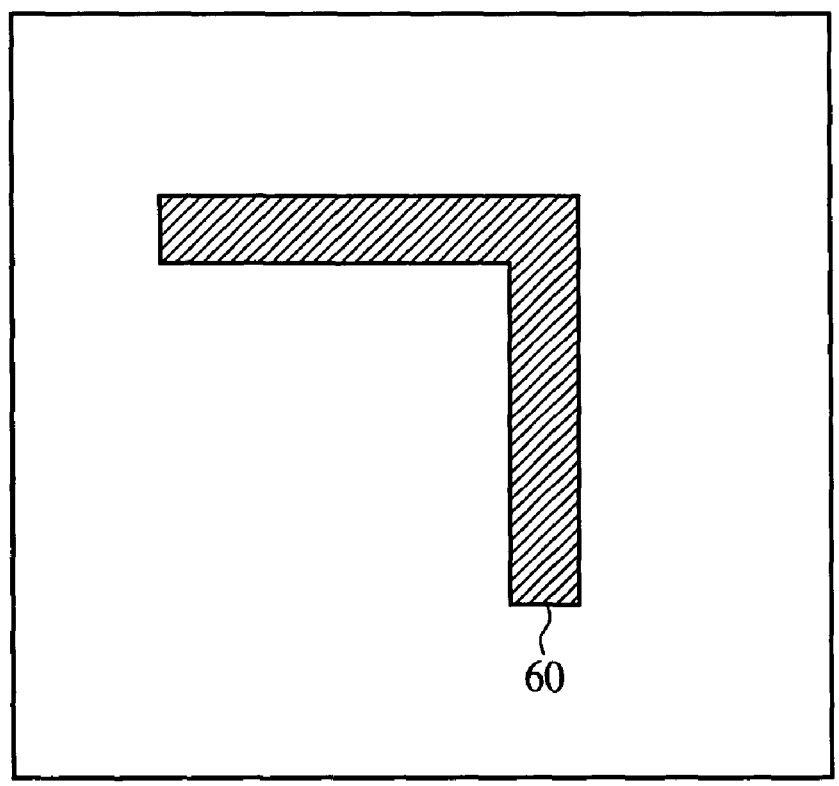
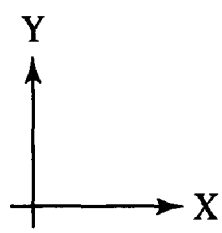

FIG. 18
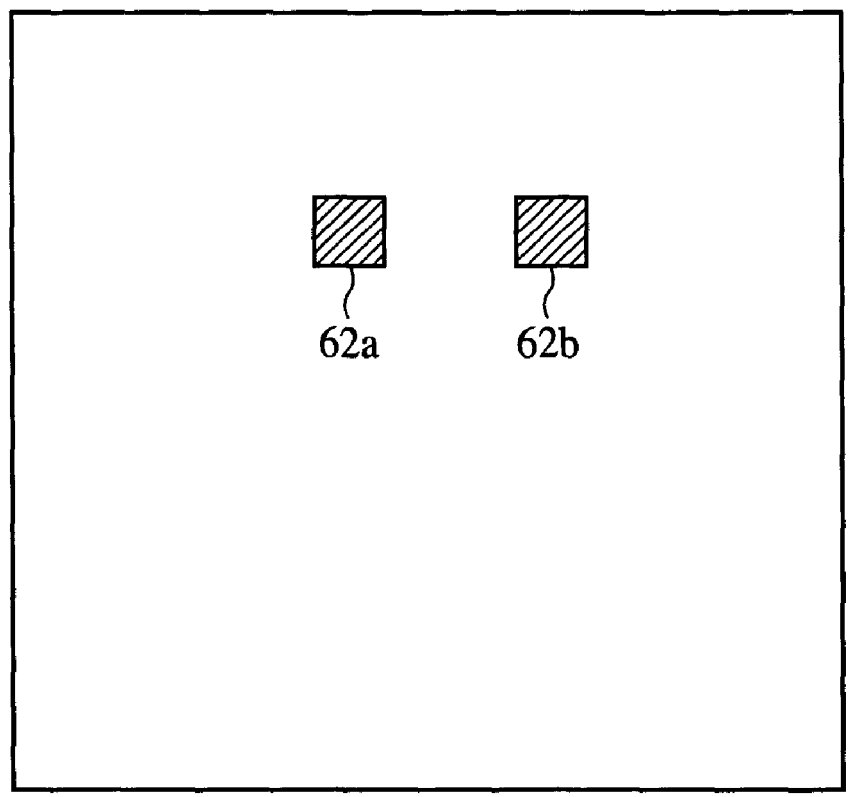
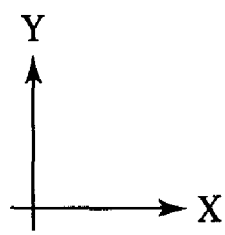

FIG. 20
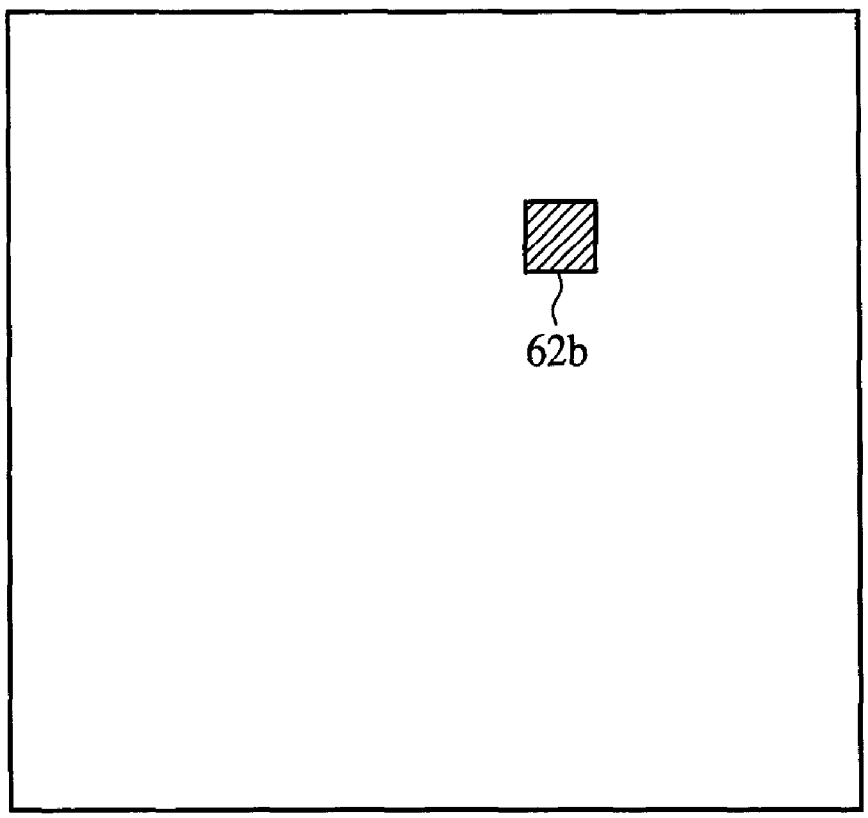
62b
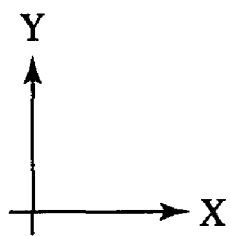

METHOD FOR FABRICATING SEMICONDUCTOR DEVICE AND EXPOSURE MASK

CROSS REFERENCE TO RELATED APPLICATIONS

This application is based upon and claims the benefit of priorities from the prior Japanese Patent Application No. 2006-195434, filed on Jul. 18, 2006, the entire contents of which are incorporated herein by reference.

BACKGROUND OF THE INVENTION

The present invention relates to a method for fabricating a semiconductor device and an exposure mask, more specifically, a method for fabricating a semiconductor device which suppresses pattern deformations due to optical proximity effect, and an exposure mask used in the method for fabricating the semiconductor device.

The downsizing of semiconductor devices is realized by shortening the light source wavelength of the exposure systems used in photolithography. Presently, as the light source, argon fluoride (ArF) excimer lasers having wavelength of 0.193 µm have come to be used, and the rule of semiconductor devices has reached the level of not more than 0.1 µm, which is shorter than said wavelength.

In transferring patterns thus exceeding the resolution limit of the exposure wavelength onto a substrate, the positions and the shapes of the ends of the patterns formed on the substrate are changed, and differences are generated between the dimensions of the mask patterns and the dimensions of the patterns transferred on the substrate.

For example, when patterns are transferred onto a substrate with an exposure mask having the patterns 102, 104 as shown in FIG. 23A, the resolution limit takes place at the ends of the patterns, and the transferred patterns 102', 107' have the ends shortened as shown in FIG. 23B. This phenomenon is called shortening. The shortening takes place more conspicuously as the pattern width is smaller.

Then, various methods for suppressing such optical proximity effect have been proposed. As one of them, the method for correcting the optical proximity effect called OPC (Optical Proximity Correction) is disclosed in, e.g., Reference 1 (Japanese published unexamined patent application No. Hei 10-289861), Reference 2 (Japanese published unexamined patent application No. 2001-356465) and Reference 3 (Japanese published unexamined patent application No. 2002-250999), etc. The OPC is a method for correcting shapes and dimensions of patterns transferred on a substrate by locally widening mask patterns in advance or laying out dummy patterns in directions opposite to directions of deformations of patterns taking place when the mask patterns are transferred onto the substrate.

Specifically, patterns called hummer heads, which have assist patterns 102a on both sides of the ends of mask patterns 102 as exemplified in FIG. 24A, or as exemplified in FIG. 24B, assist patterns 102b extending the ends of the mask patterns by the same length are laid out, whereby shape changes of the transferred patterns, such as shortening, etc., can be suppressed.

The other related arts are disclosed in, e.g., Reference 4 (Japanese published unexamined patent application No. Hei 10-092714), etc.

However, when mask patters are proximate to each other at the ends, the assist patterns cannot be allowed to be sufficiently large. This is because with the assist patterns being proximate to each other, the transferred patterns become continuous due to the optical proximity effect at the parts where the assist patterns have been added (see FIG. 24C). Accordingly, the assist patterns cannot sufficiently suppress the shortening.

Usually, interconnections have contacts at the ends, and when the shortening takes place in the interconnection patterns, the overlap of the interconnections over the hole patterns becomes insufficient. Accordingly, the contact between the interconnections and the contact plugs buried in the holes becomes insufficient, and, in the worst case, disconnections often take place.

SUMMARY OF THE INVENTION

An object of the present invention is to provide a method for fabricating a semiconductor device which can prevent the deformation of patterns and defective contacts between interconnections, and an exposure mask suitable for preventing them.

According to one aspect of the present invention, there is provided a method of manufacturing a semiconductor device comprising the steps of: forming a first photoresist film over a substrate; exposing to the first photoresist film a first mask pattern having an interconnection pattern; exposing to the first photoresist film a second mask pattern having a hole positioned at an end or a bent portion of the interconnection pattern where a hole to be connected to the interconnection pattern is to be formed; and developing the first photoresist film with the first mask pattern and the second mask pattern exposed to.

According to another aspect of the present invention, there is provided an exposure mask to be used in forming interconnection patterns comprising: a mask pattern having holes positioned at ends and/or bent portions of the interconnection patterns, which are extracted from an another mask pattern having holes to be connected to the interconnection patterns.

According to the present invention, in the photolithography step for forming an interconnection pattern, an interconnection pattern, and a hole pattern to be connected to an end and/or an bent portion of the interconnection pattern are doubly exposed, whereby insufficient exposure energy at the pattern end and the bent portion due to optical proximity effect can be prevented. Thus, the shortening at the pattern end or the rounding at the pattern bent portion can be prevented, and the contact of the pattern end or the bent portion with the contact plug can be ensured.

The mask data of the exposure mask to be used in the double exposure can be prepared only by extracting from the mask data of the exposure mask for forming hole patterns the holes which are positioned at the ends and/or the bent portions of the interconnection patterns, which permits the additional exposure mask to be prepared without adding large design works.

BRIEF DESCRIPTION OF THE DRAWINGS

FIGS. 5A-5C, 6A-6C, 7A-7C, 8A-8C, 9A-9C and 10A-10B are sectional views showing the steps of the method for fabricating the semiconductor device according to the first embodiment of the present invention.

FIGS. 17-20 are plan views of mask patterns of the exposure mask used in the method for fabricating the semiconductor device according to a second embodiment of the present invention.

DETAILED DESCRIPTION OF THE PREFERRED EMBODIMENTS

A First Embodiment

The exposure mask and the method for fabricating the semiconductor device according to a first embodiment of the present invention will be explained with reference to FIGS. 1 to 14.

Figure 1:
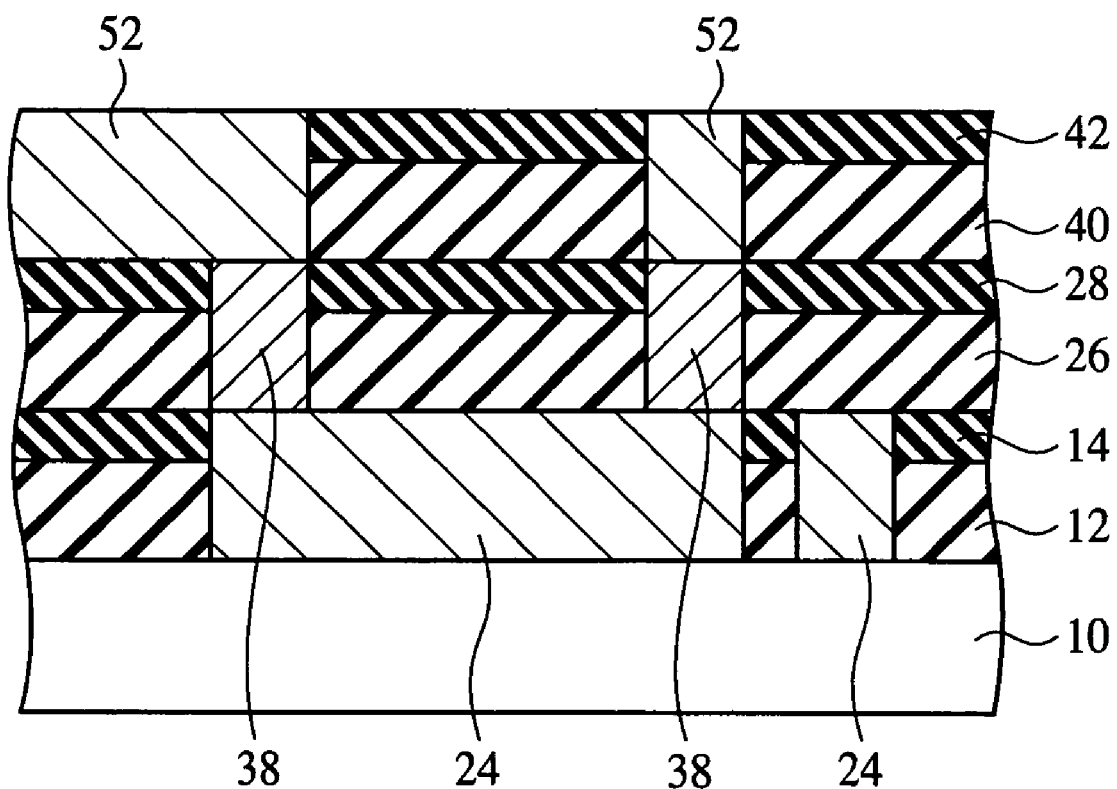
FIG. 1 is a diagrammatic sectional view showing the structure of the semiconductor device according to a first embodiment of the present invention.
Figure 12:
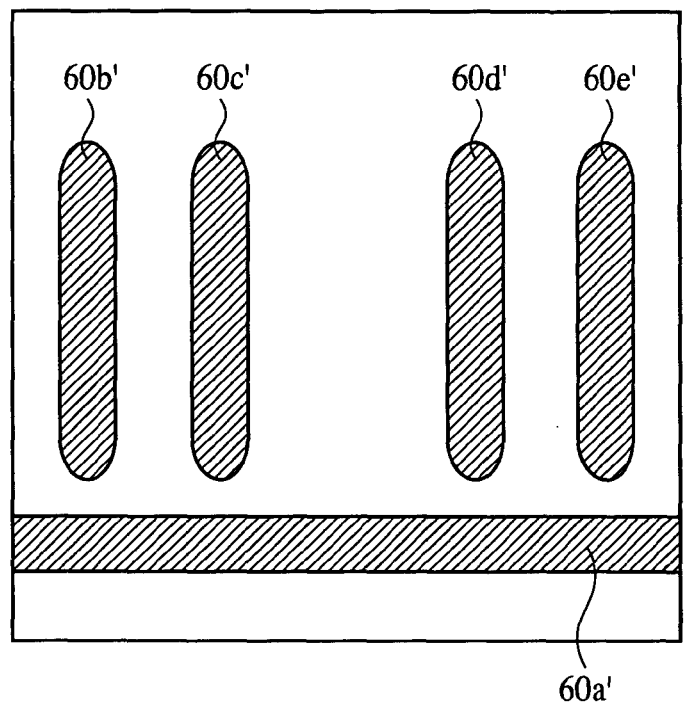
FIG. 12 is a plan view of the patterns formed by using the exposure mask shown in FIG. 2.
Figure 13:
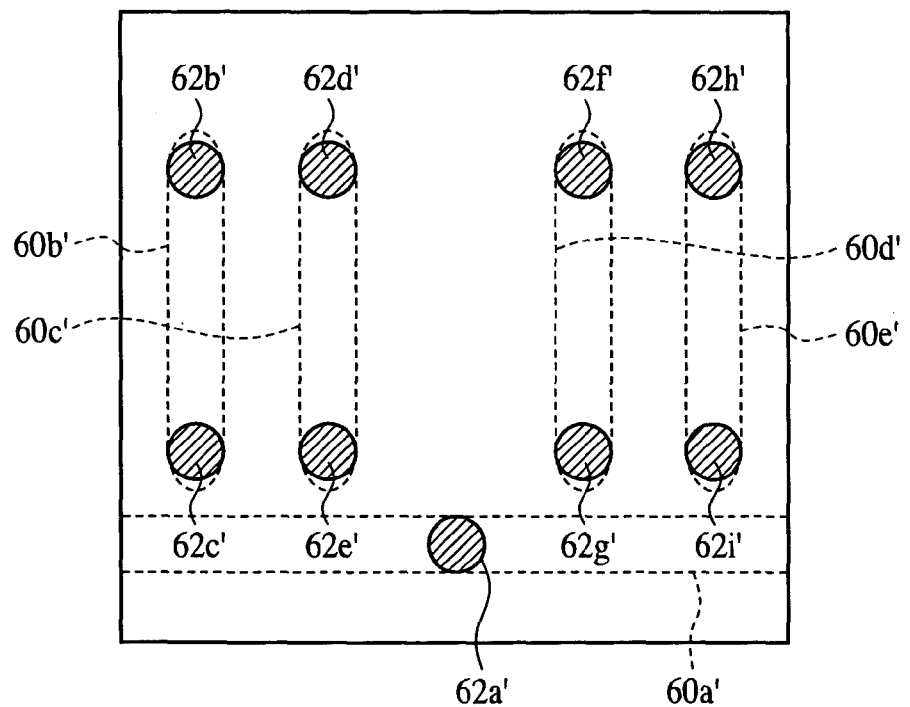
FIG. 13 is a plan view of the patterns formed by using the exposure mask shown in FIG. 3.
Figure 14:
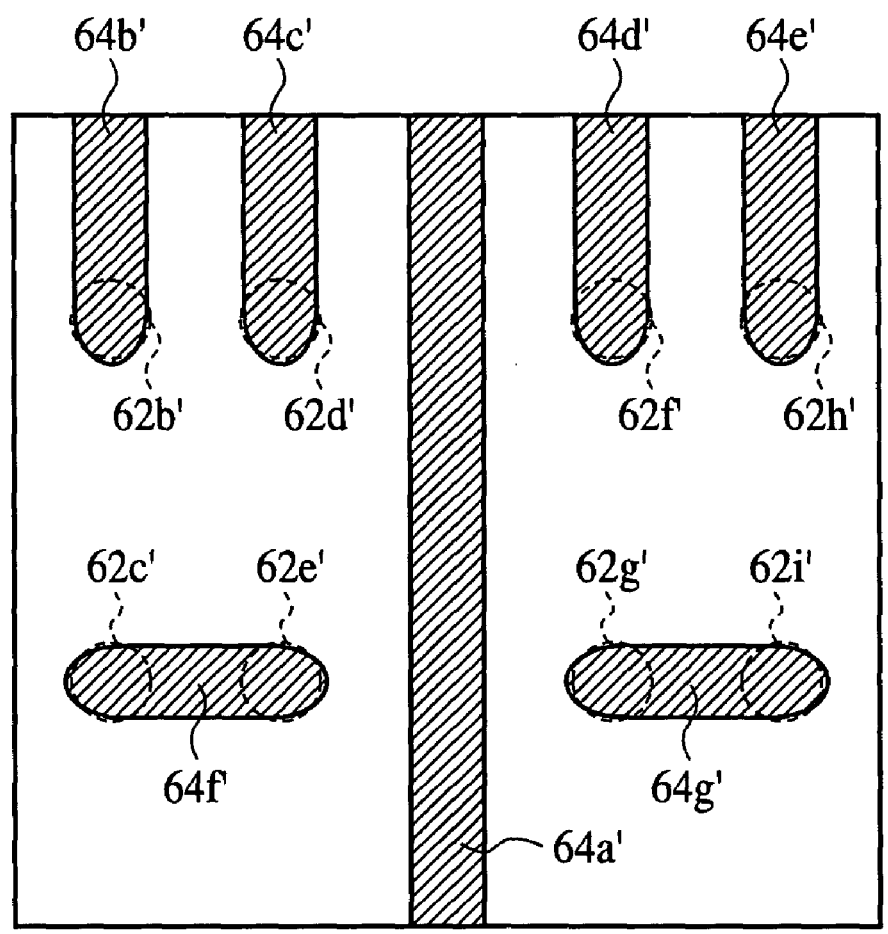
FIG. 14 is a plan view of the patterns formed by using the exposure mask shown in FIG. 4.

FIG. 1 is a diagrammatic sectional view showing the structure of the semiconductor device according to the present embodiment. FIGS. 2-4 and 11 are plan views of the mask pattern of the exposure mask used in the method for fabricating the semiconductor device according to the present embodiment. FIGS. 5A-5C, 6A-6C, 7A-7C, 8A-8C, 9A-9C and 10A-10B are sectional views showing the steps of the method for fabricating the semiconductor device according to the first embodiment of the present invention. FIGS. 12-14 are plan views of the patterns formed by using the exposure mask shown in FIGS. 2-4.

First, the structure of the semiconductor device fabricated by using the exposure mask according to the present embodiment will be explained with reference to FIGS. 1 to 4. FIG. 1 is the sectional view along the line A-A' in FIGS. 2 to 4.

An inter-layer insulating film 12 and an etching stopper film 14 are formed over a substrate 10. An interconnection layer 24 is buried in the inter-layer insulating film 12 and the etching stopper film 14. The interconnection layer 24 has been formed, based on the mask pattern as shown in FIG. 2.

Figure 2:
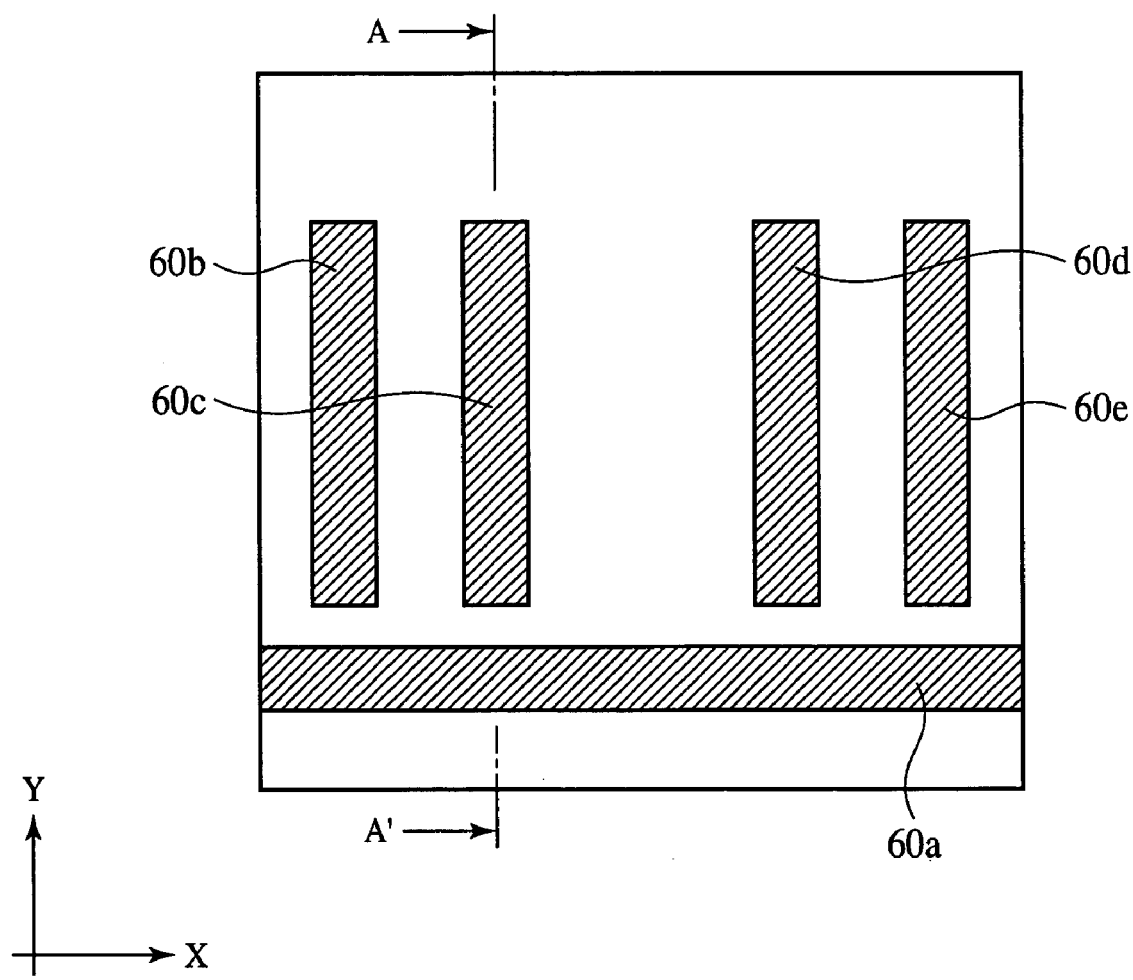
FIGS. 2-4 and 11 are plan views of the mask pattern of the exposure mask used in the method for fabricating the semiconductor device according to the first embodiment of the present invention.

The mask patterns shown in FIG. 2 include an interconnection pattern 60a extended in X-direction and a plurality of interconnection patterns 60b, 60c, 60d, 60e extended in Y-direction and having ends proximate to the interconnection pattern 60a. The interconnection layer 24 is the so-called damascene interconnection, and the interconnection patterns 60a-60e are the punched patterns on the exposure mask. That is, in FIG. 2, the shaded with the slant lines are the transmission regions, and the white regions are the shade regions (including the semi-transmission regions of the half-tone mask).

On the etching stopper film 14 with the interconnection layer 24 buried in, an inter-layer insulating film 26 and an etching stopper film 28 are formed. In the inter-layer insulating film 26 and the etching stopper film 28, contact plugs 38 are buried, connected to the interconnection layer 24. The contact plugs 38 are formed, based on the mask pattern as shown in FIG. 3.

Figure 3:
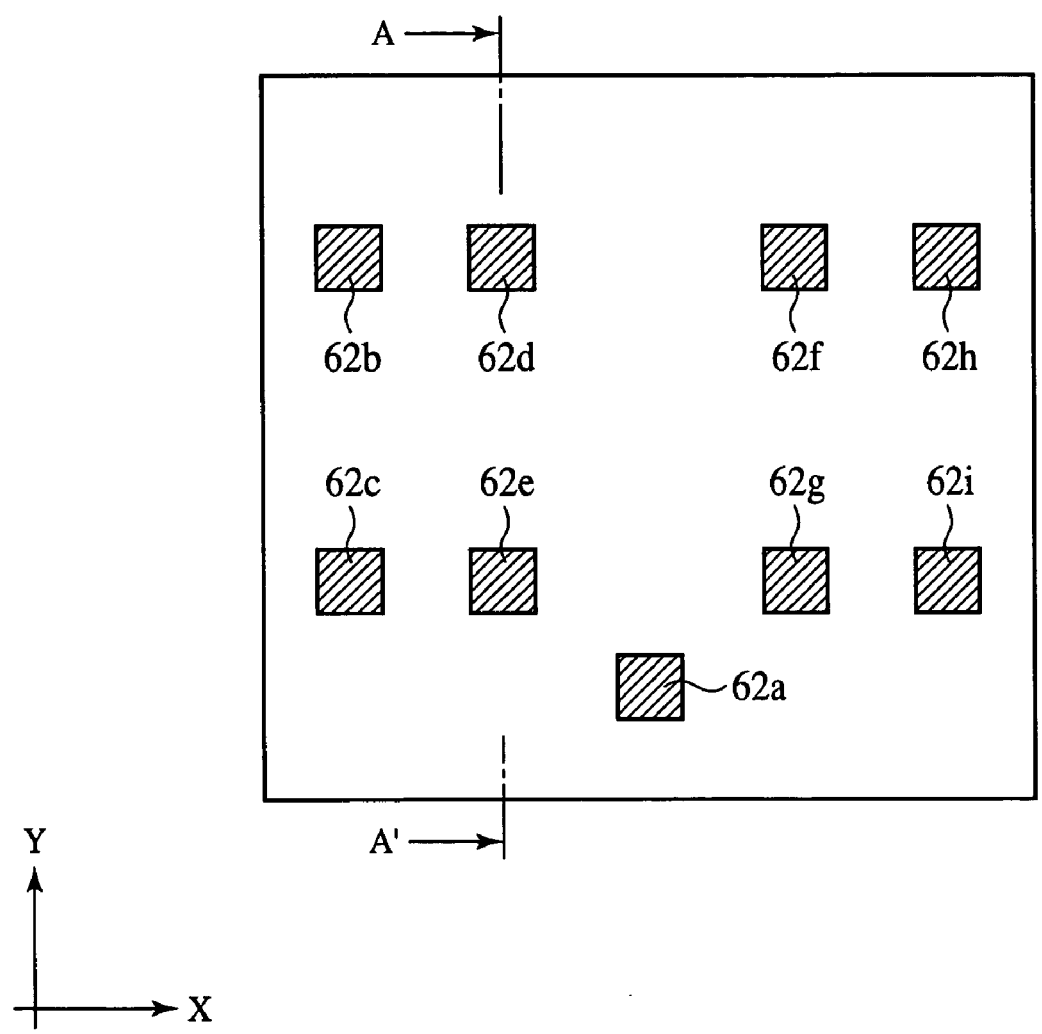

The mask pattern shown in FIG. 3 includes a hole pattern 62a for the connection to the interconnection pattern 60a, and hole patterns 62b, 62c, 62d, 62e, 62f, 62g, 62h, 62i for the connections to the both ends of the respective interconnection patterns 60b, 60c, 60d, 60e. The hole patterns 62a-62i are punched patterns on the mask. That is, in FIG. 3, the shaped regions with slant lines are the transmission regions, and the white region is the shade region (including the semi-transmission region of the half-tone mask).

On the etching stopper film 28 with the contact plugs 38 buried in, an inter-layer insulating film 40 and the etching stopper film 42 are formed. In the inter-layer insulating film 40 and the etching stopper film 42, an interconnection layer 52 is buried, electrically connected to the interconnection layer 24 via the contact plugs 38. The interconnection layer 52 is formed, based on the mask pattern as shown in FIG. 4.

Figure 4:
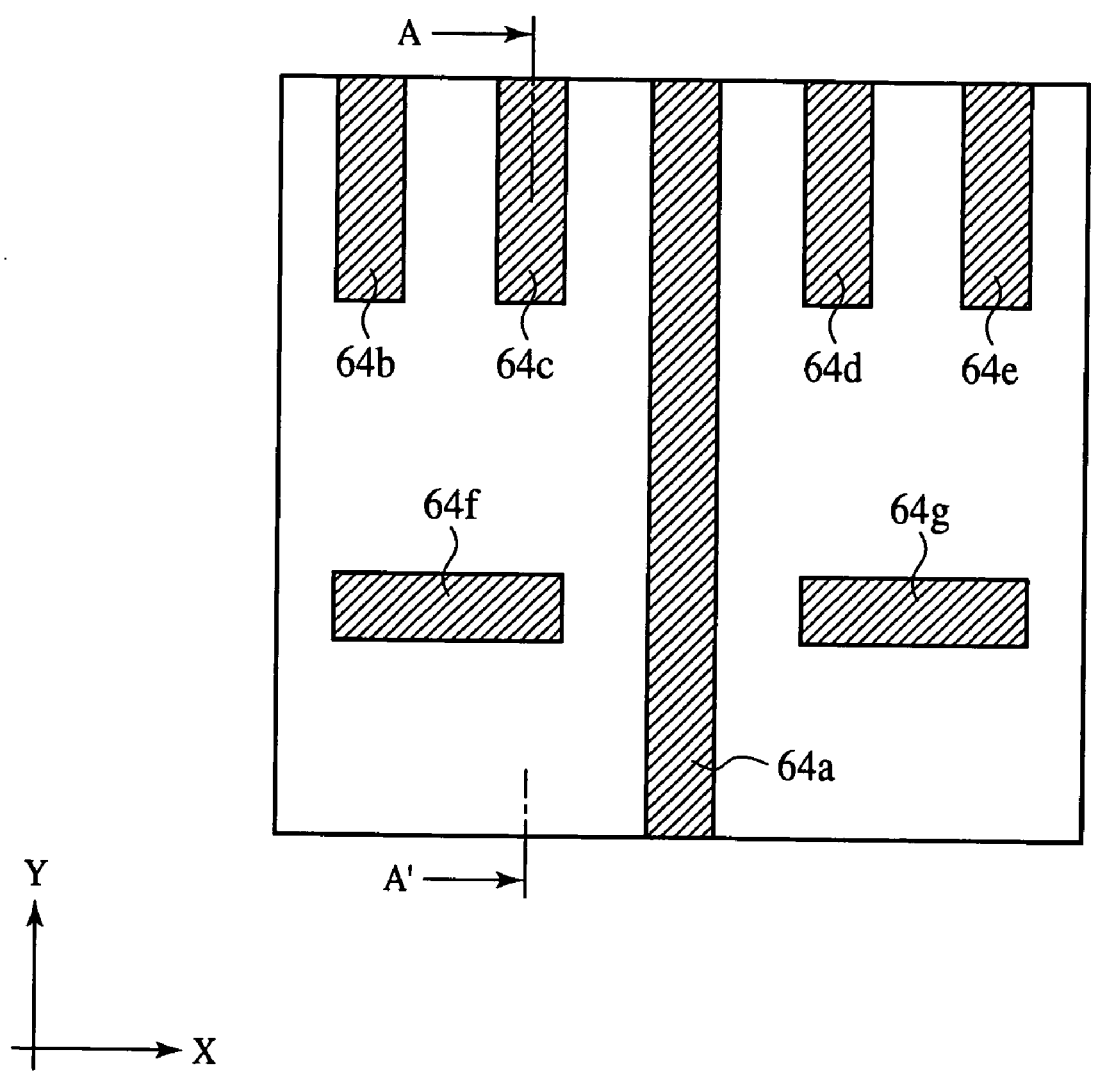

The mask pattern shown in FIG. 4 includes an interconnection pattern 64a extended in the Y-direction and connected to the contact plug 62a, an interconnection pattern 64b extended in the Y-direction and connected to the contact plug 62b, an interconnection pattern 64c extended in the Y-direction and connected to the contact plug 62d, an interconnection pattern 64d extended in the Y-direction and connected to the contact plug 62f, an interconnection 64e extended in the Y-direction and connected to the contact plug 62h, an interconnection pattern 64f extended in the X-direction and connected to the contact plug 62c and the contact plug 62e, and an interconnection pattern 64g extended in the X-direction and connected to the contact plug 62g and the contact plug 62i. The interconnection layer 52 is the so-called damascene interconnection, and the interconnection patterns 64a-64g are punched patterns on the mask. That is, in FIG. 4, the regions shaded with the slant lines are the transmission regions, and the white regions are the shade regions (including the semi-transmission regions of the half-tone mask).

Then, the method for fabricating the semiconductor device according to the present embodiment will be explained with reference to FIGS. 5A to 14. FIGS. 5A to 10B are sectional views of the semiconductor device along the line A-A' in FIGS. 2 to 4 in the steps of the method for fabricating the semiconductor device.

In the present embodiment, in forming the interconnection patterns and the hole patterns, a reduced projection exposure system whose reduction rate is ¼ times (mask pattern dimensions:dimensions of the transferred pattern on the image plane=4:1) and which includes a lens of a 0.80 numerical aperture and an ArF excimer laser (wavelength: 193 nm) as the light source is used.

First, a silicon oxycarbide (SiOC) film of, e.g., a 300 nm-thickness is deposited over a substrate 10 by, e.g., CVD method. Thus, the inter-layer insulating film 12 of the silicon oxycarbide film is formed over the substrate 10. In the specification of the present invention, the substrate includes not only the semiconductor substrate itself, but also the substrate with elements, such as transistors, etc. formed on the semiconductor substrate and with one or more interconnection layers formed thereon.

Next, a silicon nitride film of, e.g., a 150 nm-thickness is formed on the inter-layer insulating film 12 by, e.g., CVD method. Thus, the etching stopper film 14 of the silicon nitride film is formed on the inter-layer insulating film 12 (FIG. 5A).

Then, an organic material, e.g., novolak resin or others, is applied to the etching stopper film 14 by, e.g., spin coating method to form an anti-reflection film 16 of, e.g., a 80 nm-thickness.

Figure 5B:
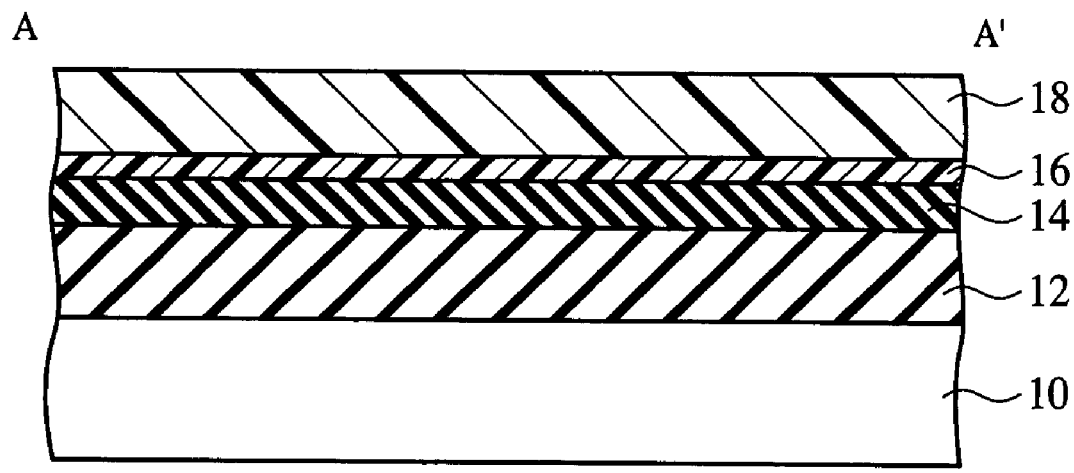

Then, a positive-type chemical amplification-type radiation sensitive material of, e.g., an organic group is applied to the anti-reflection film 16 by, e.g., spin coating method to form a photoresist film 18 of, e.g., a 250 nm-thickness (FIG. 5B).

Figure 5C:
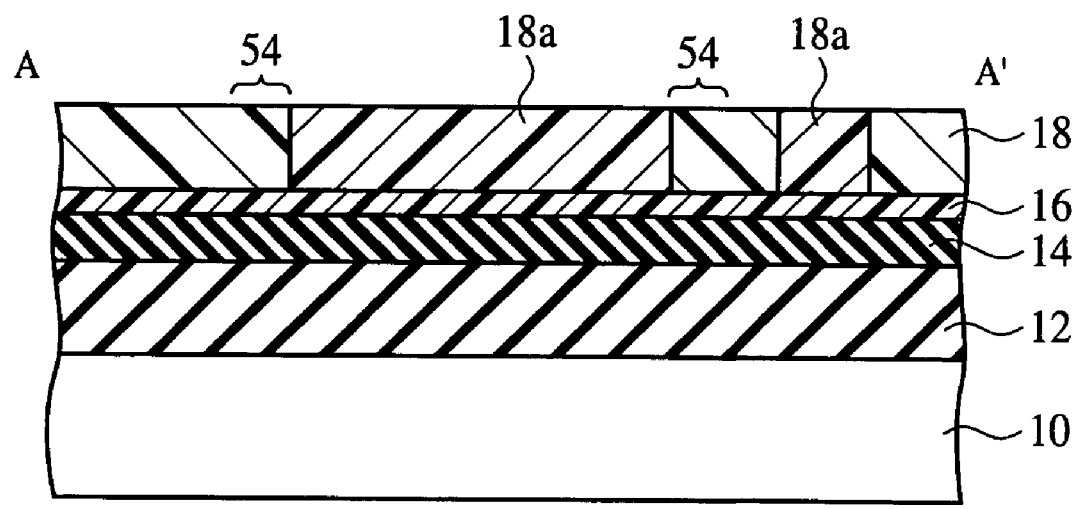

Then, the mask pattern as shown in FIG. 2 is exposed on the photoresist film 18 by an exposure system. On the mask pattern, the interconnection patterns 60a-60e of, e.g., a 100 nm-width are formed. Thus, in the exposed region of the photoresist film 18, latent images 18a reflecting the mask patterns are formed (FIG. 5C).

At this time, in the end regions 54 of the exposed interconnection patterns 60a-60e, the exposure energy cannot be sufficient due to the optical proximity effect, and the latent images 18a are not formed. Accordingly, when the photoresist film 18 is developed as it is, the shortening takes place at the ends of the interconnection patterns 60a-60e.

Figure 11:
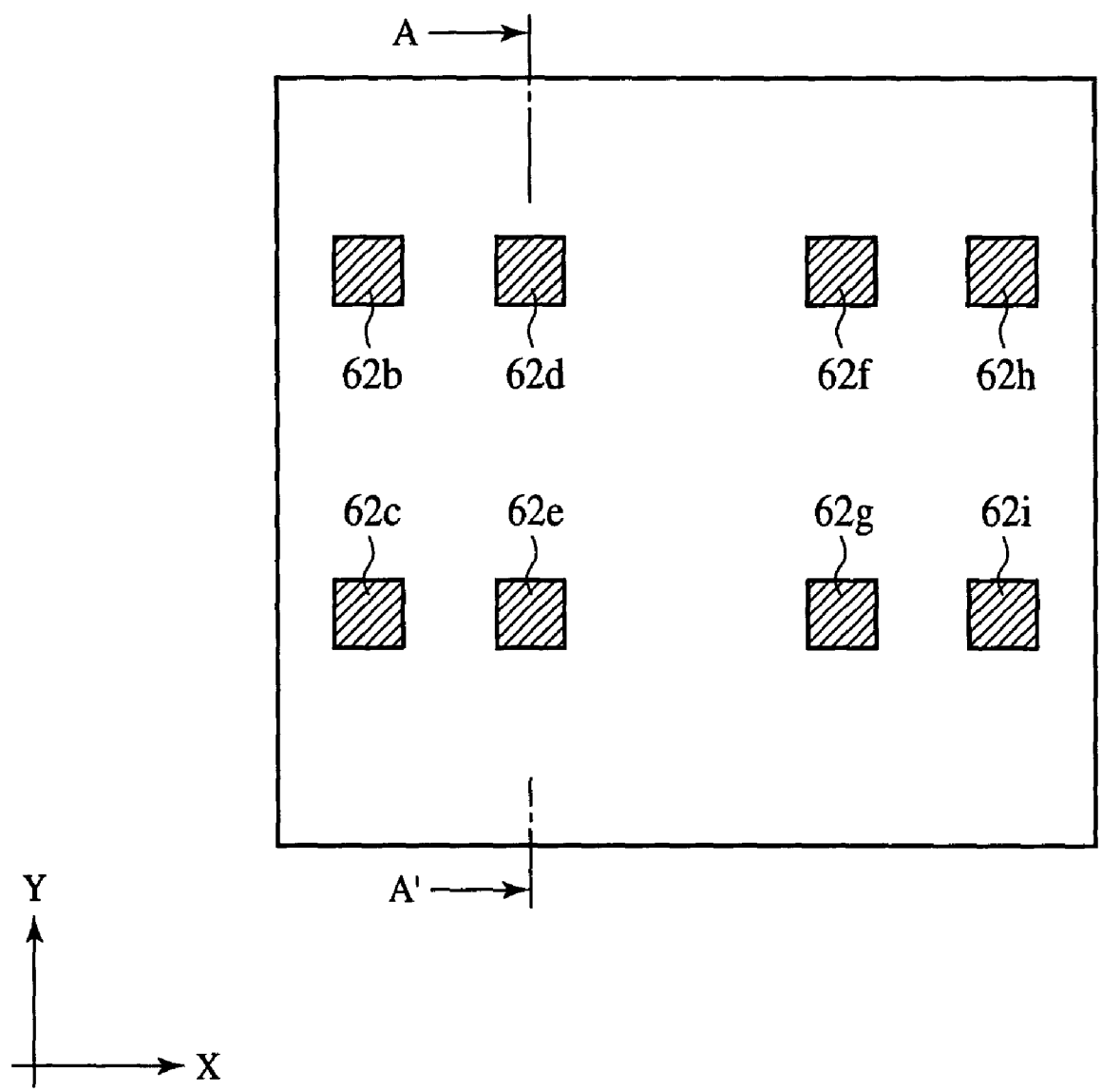

Then, in the method for fabricating the semiconductor device according to the present embodiment, an exposure mask having the mask pattern as shown in FIG. 11 is prepared and doubly exposed to the photoresist film 18 with the interconnection patterns exposed.

The mask pattern shown in FIG. 11 includes the hole patterns positioned in the end regions 54 of the interconnection patterns 60a-60e, i.e., the hole patterns 62b-62i extracted from hole patterns 62a-62i to be formed on the interconnection patterns 60a-60e (see FIG. 3).

Those of the hole patterns positioned below the interconnection patterns 60a-60e, which are positioned at the ends of the interconnection patterns 60a-60e may be added to the mask patterns shown in FIG. 11.

Figure 6A:
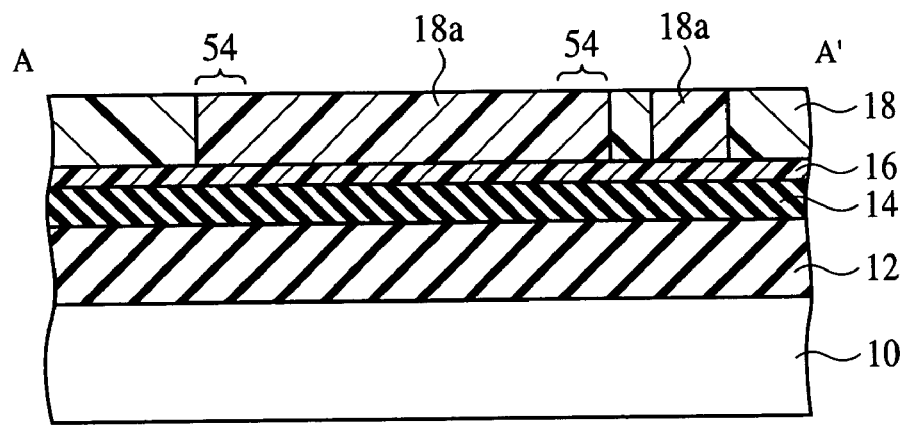

The hole patterns are doubly exposed to the photoresist film 18 with the interconnection patterns exposed, whereby a sufficient exposure energy can be obtained even at the end regions 54 of the interconnection patterns, where the sufficient exposure energy has not been obtained, and the latent images 18a can be obtained down to the end regions 54 of the interconnection patterns (FIG. 6A). Thus, the shortening at the ends of the interconnection patterns 60b-60e, where the hole patterns must be formed thereon can be prevented.

The exposure mask to be doubly exposed has the mask patterns prepared by extracting the hole patterns alone positioned in the end regions 54 of the interconnection patterns. Accordingly, the exposure mask can be doubly exposed selectively only in the end regions 54 of the interconnection patterns, where the exposure energy cannot be sufficient, and the exposure energy is prevented from being excessive in the hole patterns which are positioned at the central parts, etc. of the interconnection patterns.

Conditions for exposing the hole patterns to be doubly exposed are preferably adjusted suitably corresponding to a size of the shortening, etc., due to the optical proximity effect. In addition to the exposure conditions of the exposure system, a parameter for controlling the exposure energy in the pattern end regions 54 can be the size of the hole patterns. One of these parameters may be changed, or both may be changed.

The range where the shortening takes place due to the optical proximity effect is within twice a pattern width from the ends of the interconnection patterns. Accordingly, the hole patterns to be doubly exposed are preferably extracted the hole patterns positioned within twice a pattern width from the ends of the interconnection patterns.

The mask data of the exposure mask for the hole patterns to be doubly exposed can be prepared only by extracting the holes positioned at the ends of the interconnection patterns from the mask data for the exposure mask for forming the hole patterns to be connected to the interconnection patterns, which permits the additional exposure mask to be prepared without adding large design works.

The exposure mask for the hole patterns, which is doubly exposed is not essentially of the same kind (e.g., the transmittance of the shade portion) as the exposure mask used in forming other layers, such as interconnection patterns, etc. For example, when a half-tone mask is used as other layers of interconnection patterns, etc., the conventional photomask, which uses chrome in the shade portion, may be used as the exposure mask for the hole patterns, which is doubly exposed. Thus, the cost of the exposure mask can be decreased.

Figure 6B:
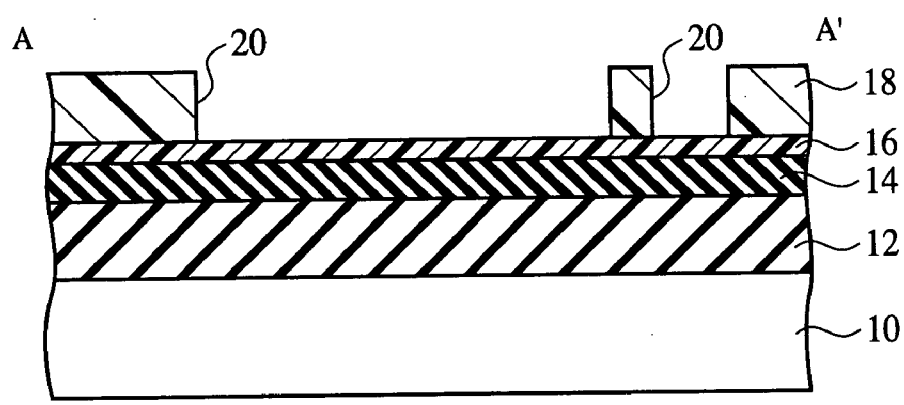

Then, the photoresist film 18 having the interconnection patterns and the hole patterns doubly exposed is developed, and the parts of the latent images 18a are removed. Thus, to the photoresist film 18, the interconnection patterns 60a'-60e' as shown in FIG. 12 are transferred, and the openings 20 are formed in the parts corresponding to the interconnection patterns 60a'-60e' (FIG. 6B).

Figure 6C:
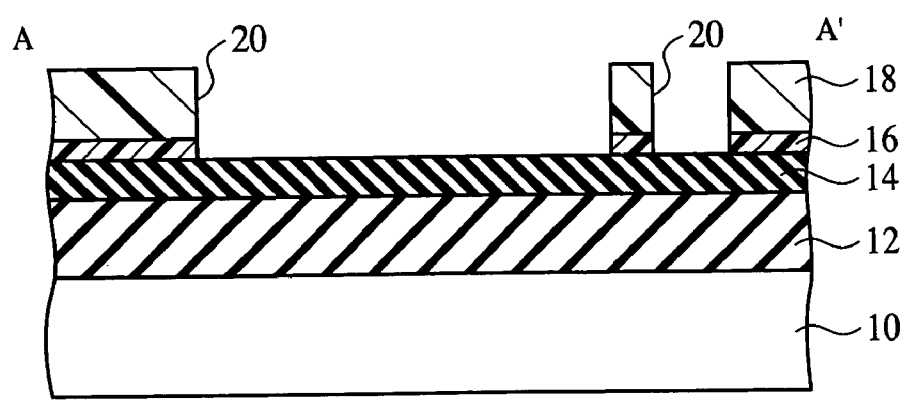

Next, with the photoresist film 18 as the mask, the anti-reflection film 16 is etched by dry etching using, e.g., fluorocarbon gas to remove the anti-reflection film 16 in the openings 20. Thus, the interconnection patterns 60a'-60e' of the photoresist film 18 are transferred to the anti-reflection film 16 (FIG. 6C).

Figure 7A:
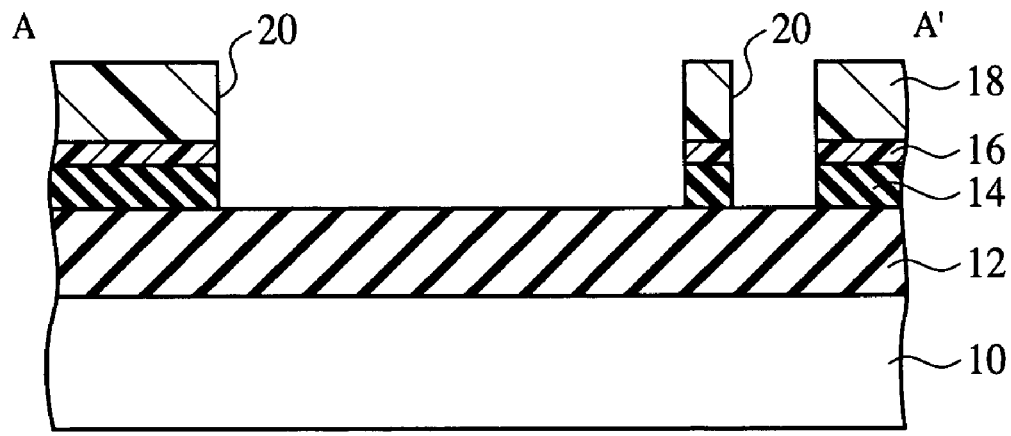
Figure 7B:
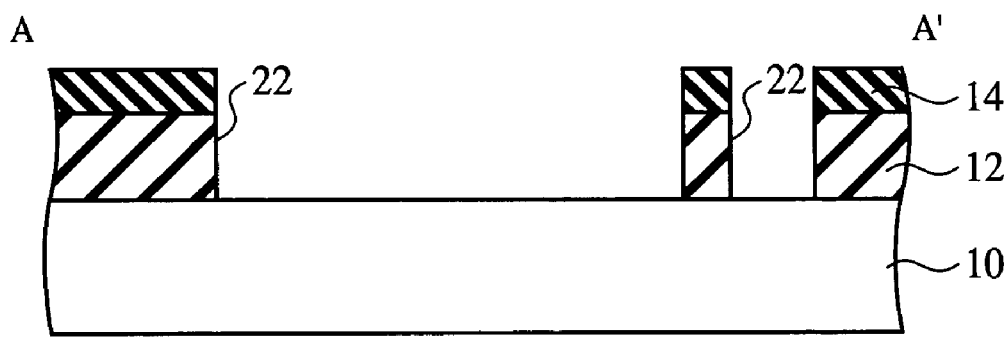

Then, with the photoresist film 18 as the mask, the etching stopper film 14 is etched by dry etching using the etching gas of, e.g., fluorocarbon gas with oxygen gas added to remove the etching stopper film 14 in the openings 20. Thus, the interconnection patterns 60a'-60e' of the photoresist film 18 are transferred to the etching stopper film 14 (FIG. 7A).

Then, the photoresist film 18 and the anti-reflection film 16 are removed by ashing with nitrogen gas or argon gas.

Then, with the etching stopper film 14 as the mask, the inter-layer insulating film 12 is etched by dry etching using the etching gas of, e.g., fluorocarbon gas with oxygen and carbon monoxide gas added to etch the inter-layer insulating film 12. Thus, interconnection trenches 22 having the interconnection patterns 60a'-60e' are formed in the etching stopper film 14 and the inter-layer insulating film 12.

Figure 7C:
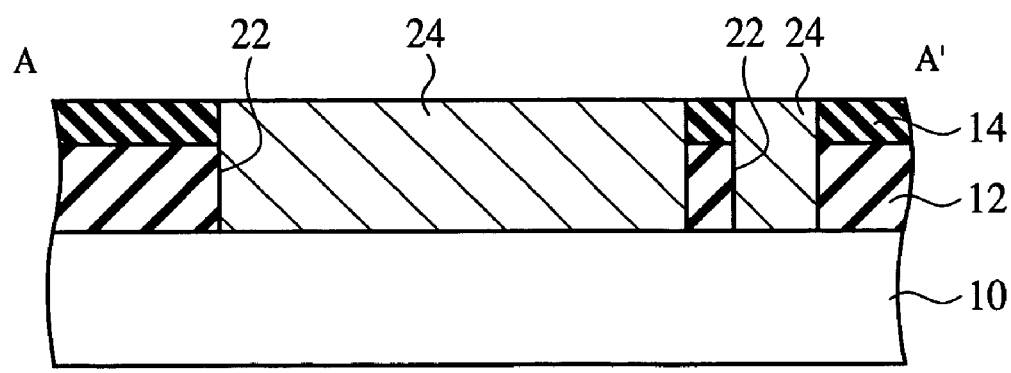

Then, the interconnection layer 24 buried in the interconnection trenches 22 is formed (FIG. 7C). The interconnection layer 24 buried in the interconnection trenches 22 is formed, e.g., by depositing a titanium nitride film as a diffusion preventing film and a copper film as a seed layer by sputtering method, further growing the copper film by electrolytic plating method with the copper film as the seed, and then removing the copper film and the tantalum nitride film over the etching stopper film 14 by CMP method.

Then, on the etching stopper film 14 with the interconnection layer 24 buried in, a silicon oxycarbide film of, e.g., a 300 nm-thickness is deposited by, e.g., CVD method. Thus, the inter-layer insulating film 26 of the silicon oxycarbide film is formed.

Figure 8A:
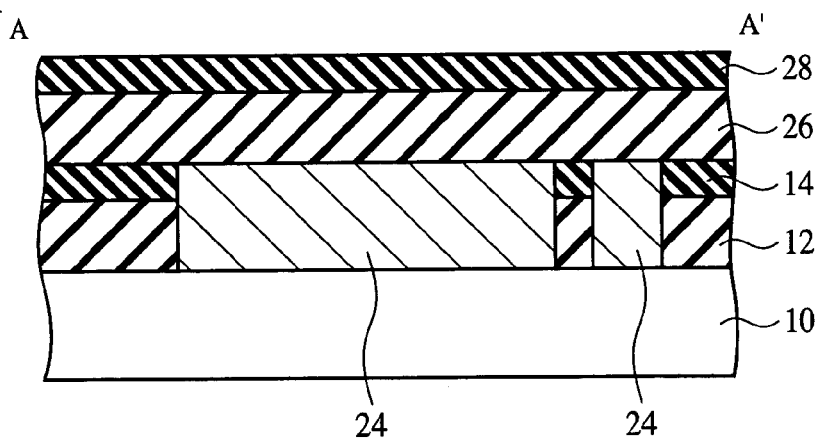

Next, a silicon nitride film of, e.g., a 150 nm-thickness is deposited on the inter-layer insulating film 26 by, e.g., CVD method. Thus, the etching stopper film 28 of the silicon nitride film is formed (FIG. 8A).

Next, in the same way as in, e.g., the step of FIG. 5B, an anti-reflection film 30 and a photoresist film 32 are formed on the etching stopper film 28.

Then, the mask pattern as exemplified in FIG. 3 is exposed to the photoresist film 32 by the exposure system. This mask pattern has the hole patterns 62a-62i of, e.g., a 100 nm-diameter.

Next, the photoresist film 32 with the hole patterns exposed to is developed. Thus, to the photoresist film 32, the hole patterns 62a'-62i' as shown in FIG. 13 are transferred, and openings 34 are formed in the parts corresponding to the hole patterns 62a'-62i'.

Figure 8B:
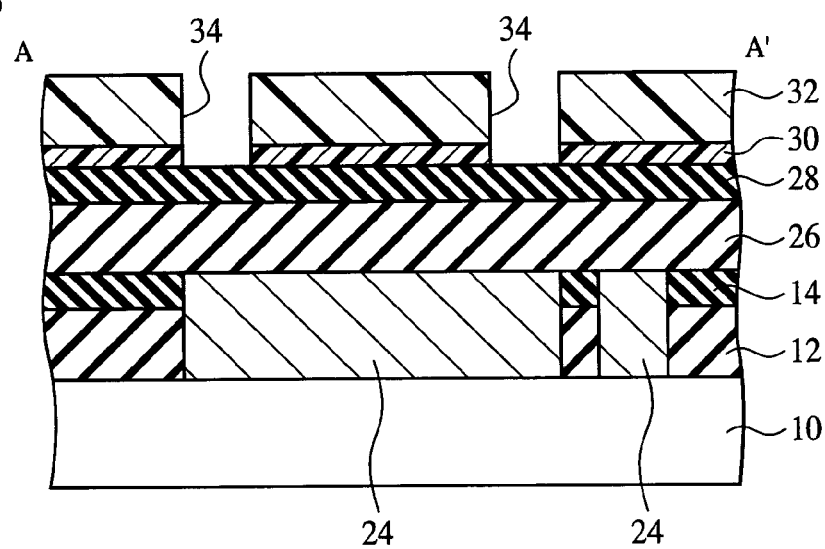

Then, with the photoresist film 32 as the mask, the anti-reflection film 30 is etched by dry etching using, e.g., fluorocarbon gas to remove the anti-reflection film 30 in the openings 34. Thus, the hole patterns 62a'-62i' formed in the photoresist film 32 are transferred to the anti-reflection film 30 (FIG. 8B).

Then, the etching stopper film 28 is etched by dry etching using the etching gas of, e.g., fluorocarbon gas with oxygen gas added to remove the etching stopper film 28 in the openings 34. Thus, the hole patterns 62a'-62i' formed in the photoresist film 32 are transferred to the etching stopper film 28.

Then, the photoresist film 32 and the anti-reflection film 30 are removed by ashing with nitrogen gas or argon gas.

Figure 8C:
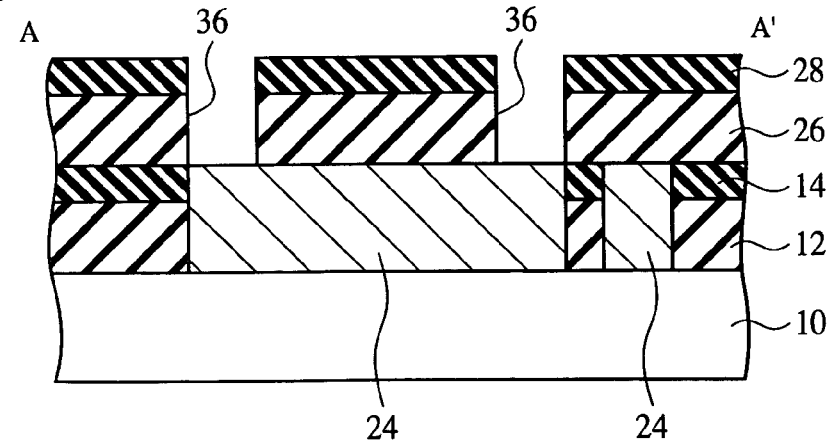

Next, with the etching stopper film 28 as the mask, the inter-layer insulating film 26 is etched by dry etching using the etching gas of, e.g., fluorocarbon gas with oxygen and carbon monoxide gas to etch the inter-layer insulating film 26. Thus, the contact holes 36 having the hole patterns 62a'-62i' are formed in the etching stopper film 28 and the inter-layer insulating film 26 (FIG. 8C). At this time, the shortening of the interconnection patterns is prevented in the end regions 54 of the interconnection layer 24, which permits the contact holes 36 to be surely opened over the interconnection layer 24 (see FIG. 13).

Figure 9A:
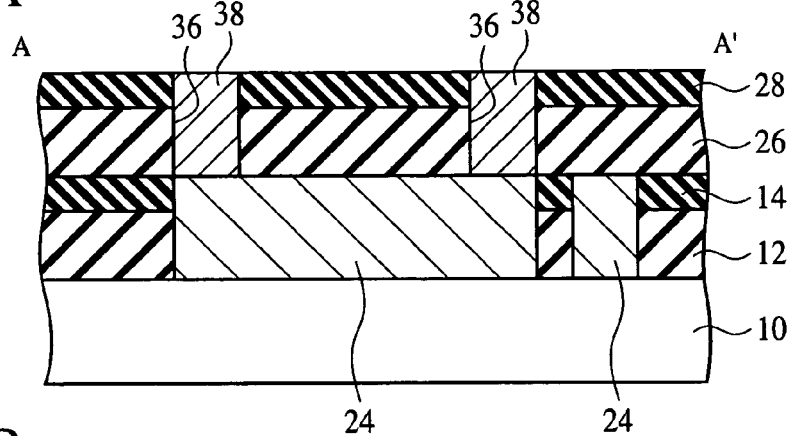

Then, the contact plugs 38 buried in the contact holes 36 are formed (FIG. 9A). For example, a tantalum nitride film as the diffusion preventing film and a copper film as a seed layer are deposited by sputtering method, and the copper film is further grown by electrolytic plating method with the copper film as the seed, and then the copper film and the tantalum nitride film over the etching stopper film 28 are removed by CMP method to thereby form the contact plugs 38 buried in the contact holes 36.

Next, on the etching stopper film 28 with the contact plugs 38 buried in, a silicon oxycarbide film of, e.g., a 300 nm-thickness is deposited by, e.g., CVD method. Thus, the inter-layer insulating film 40 of the silicon oxycarbide film is formed.

Figure 9B:
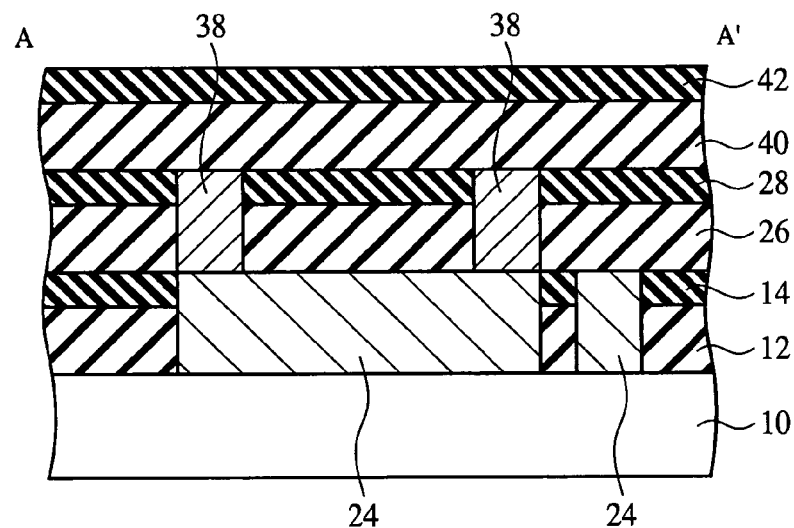

Then, on the inter-layer insulating film 40, a silicon nitride film of, e.g., a 150 nm-thickness is deposited by, e.g., CVD method. Thus, an etching stopper film 42 of the silicon nitride film is formed (FIG. 9B).

Next, in the same way as in, e.g., the step of FIG. 5B, an anti-reflection film 44 and a photoresist film 46 are formed on the etching stopper film 42.

Then, in the same way as, e.g., in the steps of FIGS. 5C to 6A, by the exposure system the mask patterns having the interconnection patterns 64a-64g as shown in FIG. 4 and the mask patterns (not shown) having the hole patterns connected to the ends of the interconnection patterns 64a-64g are doubly exposed. The width of the interconnection patterns 64a-64g is, e.g., 100 nm. Thus, the shortening in the end regions of the interconnection patterns 64a-64g, where the hole patterns must be formed, can be prevented.

Then, the photoresist film 46 having the interconnection patterns and the hole patterns doubly exposed is developed. Thus, to the photoresist film 46, the interconnection patterns 64a'-64g' as shown in FIG. 14 are transferred, and openings 48 are formed in the parts corresponding to the interconnection patterns 64a'-64g'.

Figure 9C:
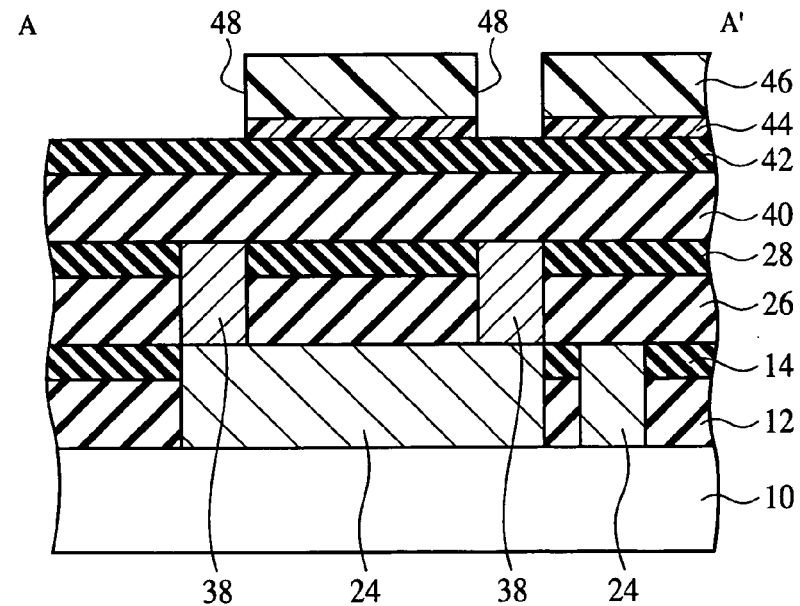

Next, with the photoresist film 46 as the mask, the anti-reflection film 44 is etched by dry etching using, e.g., fluorocarbon gas to remove the anti-reflection film 44 in the openings 48. Thus, the interconnection patterns 64a'-64g' formed in the photoresist film 46 are transferred to the anti-reflection film 44 (FIG. 9C).

Next, with the photoresist film 46 as the mask, the etching stopper film 42 is etched by dry etching using the etching gas of, e.g., fluorocarbon gas with oxygen gas added to remove the etching stopper film 42 in the openings 48. Thus, the interconnection patterns 64a'-64g' formed in the photoresist film 46 are transferred to the etching stopper film 42.

Next, the photoresist film 46 and the anti-reflection film 44 are removed by ashing using nitrogen gas or argon gas.

Then, with the etching stopper film 42 as the mask, the inter-layer insulating film 40 is etched by dry etching using the etching gas of, e.g., fluorocarbon gas with oxygen and carbon monoxide gas added. Thus, interconnection trenches 50 having the interconnection patterns 64a'-64g' are formed in the etching stopper film 42 and the inter-layer insulating film 40 (FIG. 10A) At this time, the shortening of the interconnection patterns 64a'-64g' is prevented in the end regions of the interconnection trenches 50, which permits the ends of the interconnection trenches 50 to be surely opened on the contact plugs 38 (see FIG. 14).

Figure 10A:
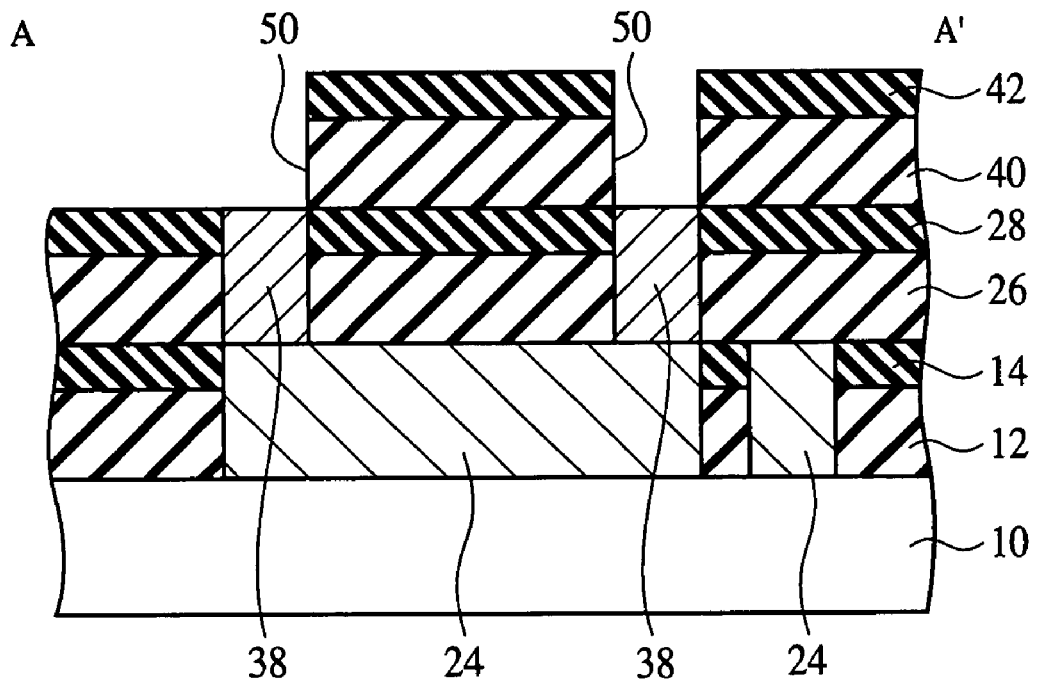
Figure 10B:
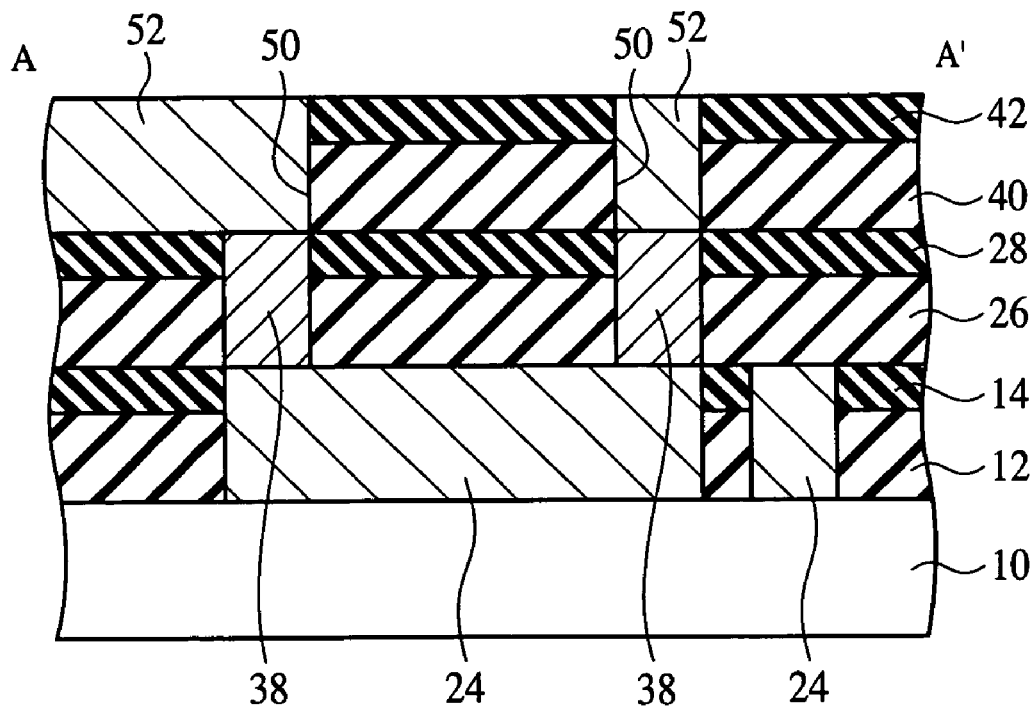

Next, the interconnection layer 52 buried in the interconnection trenches 50 is formed (FIG. 10B). For example, a tantalum nitride film as a diffusion preventing film and a copper film as a seed layer are deposited by sputtering method, the copper film is further grown by electrolytic plating method with the copper film as the seed, and then the copper film and the tantalum nitride film over the etching stopper film 42 are removed by CMP method to thereby form the interconnection layer 52 buried in the interconnection trenches 50.

Then, upper interconnection layers, etc. are further formed as required, and the semiconductor device is completed.

To prove the advantageous effect of the present invention, the size of the shortening was compared between the case where the OPC was made in the hummer head shape and the case where the present invention was applied. The dimensions of the patterns here are not dimensions on the mask but finished dimensions.

The patterns were formed with the exposure mask having an interconnection pattern respectively in the hummer head shape formed by adding assist patterns of a 20 nm-width and an 80 nm-length to both sides of the respective ends of the interconnection pattern of a 100 nm-width. The shortening of about 35 nm took place at the ends of the interconnection pattern.

In contrast to this, the patterns were formed by exposing with the exposure mask having an interconnection pattern uniformly of a 100 nm-width, then doubly exposing with the exposure mask having the hole patterns of a 100 nm-square over the ends of the interconnection pattern and with an exposure energy reduced by 40% of the suitable exposure energy for the usual hole patterns. The shortening at the ends of the interconnection pattern could be suppressed to about 10 nm.

The patterns were formed by exposing with the exposure mask having an interconnection pattern uniformly of a 100 nm-width, then doubly exposing with the exposure mask having the hole patterns of a 82 nm-square over the ends of the interconnection pattern and with a suitable exposure energy for the usual hole patterns. The shortening at the ends of the interconnection pattern could be suppressed to about 10 nm.

As described above, according to the present embodiment, in the photography step of forming the interconnection pattern, the interconnection pattern, and the hole patterns to be connected to the ends of the interconnection pattern are doubly exposed, whereby the insufficiency of the exposure energy at the ends of the patterns due to the optical proximity effect can be compensated. Thus, the shortening at the pattern ends can be prevented, and the contact with the contact plugs to be connected to the pattern ends can be ensured.

The mask data of the exposure mask to be used in the double exposure can be prepared only by extracting holes positioned at the ends of the interconnection patterns from the mask data of the exposure mask for forming the hole patterns, which allows the additional exposure mask to be prepared without adding large design works.

A Second Embodiment

The exposure mask and the method for fabricating the semiconductor device according to a second embodiment of the present invention will be explained with reference to FIGS. 15A to 20. The members of the present embodiment as those of the exposure mask and the semiconductor device according to the first embodiment shown in FIGS. 1 to 14 are represented by the same reference numbers not to repeat or to simplify their explanation.

FIGS. 15 and 16 are plan views showing the rounding of a pattern at the bent portion due to the optical proximity effect. FIGS. 17-20 are plan views of mask patterns of the exposure mask used in the method for fabricating the semiconductor device according to the present embodiment.

In the present embodiment, the present invention is applied to the case that a hole pattern is positioned at a bent portion of an interconnection pattern.

Figure 15A:
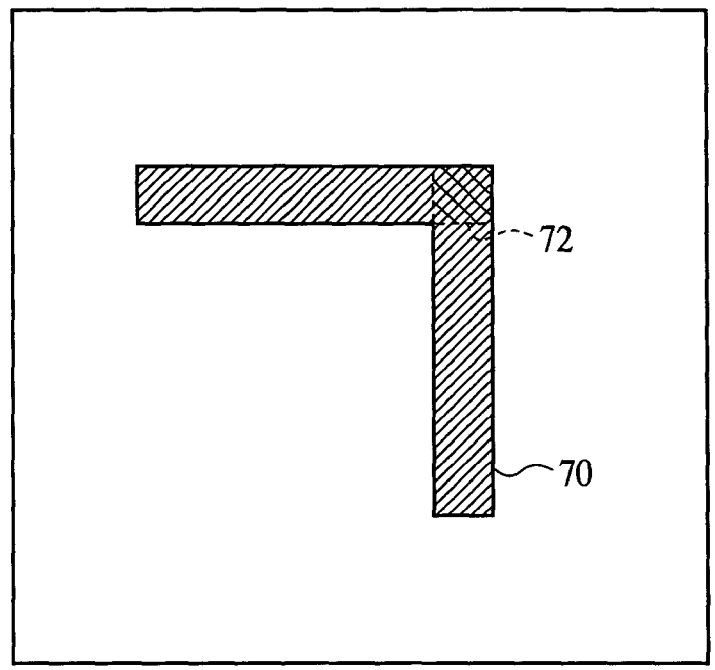
FIGS. 15A and B and 16A and B are plan views showing the rounding of a pattern at the bent portion due to the optical proximity effect.
Figure 15B:
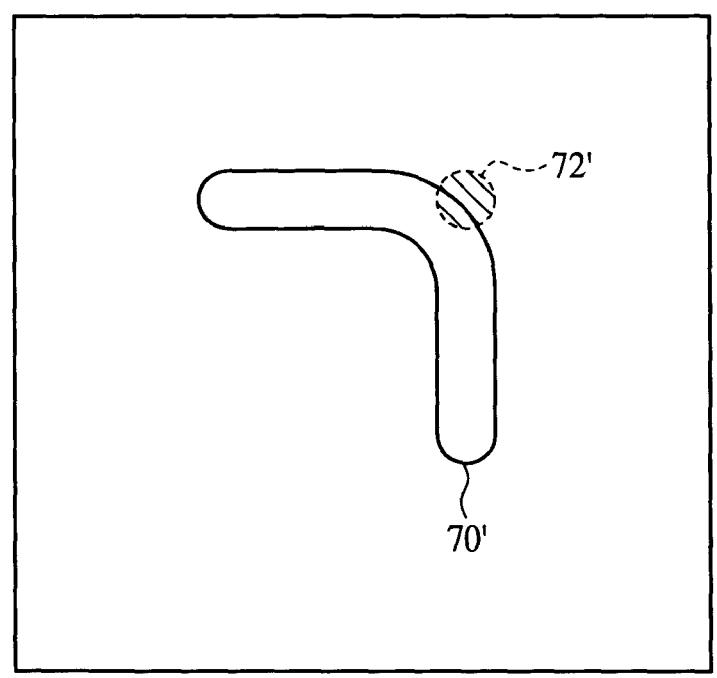

The optical proximity effect causes not only the shortening at the ends of the patterns in the first embodiment but also rounding of the patterns at the bent portions. For example, in an interconnection pattern 70 which is bent at a right angle as shown in FIG. 15A, when the optical proximity effect takes place, the rounding takes place at the bent portion of a transferred interconnection pattern 70' as shown in FIG. 15B. The bent portion is receded toward the inside, and the rounding is caused. When a hole pattern 72 is present at the bent portion, defective connection often takes place between the transferred interconnection pattern 70' and the hole pattern 72'.

Figure 16A:
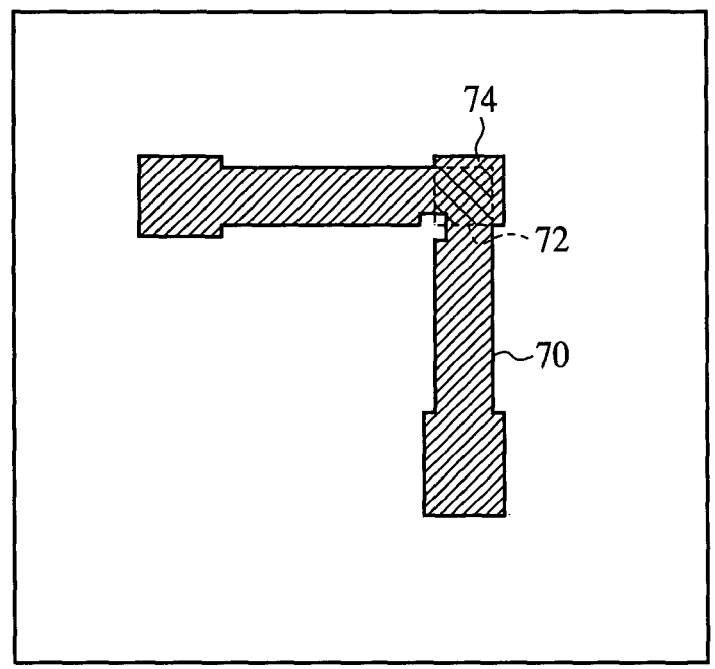
Figure 16B:
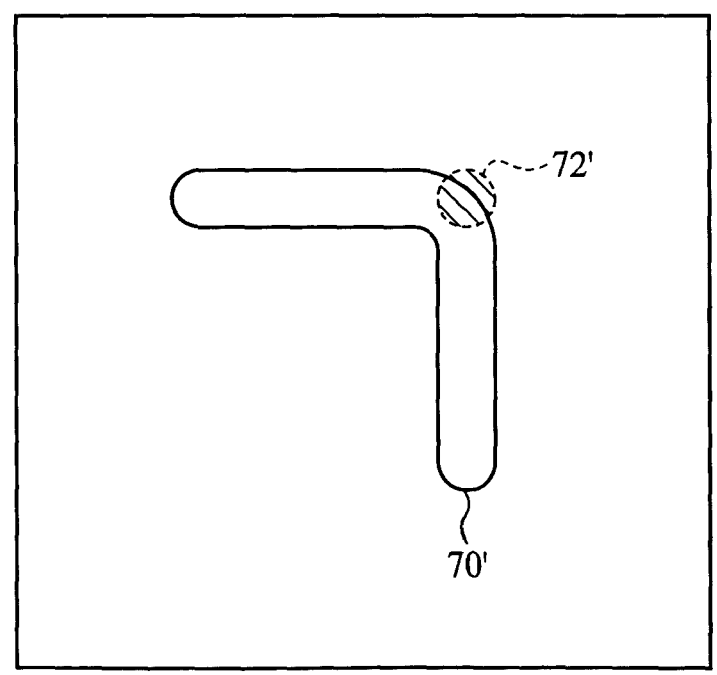

As an OPC to be made to the bent interconnection pattern 70, an assist pattern 74 is provided at the bent portion, as shown in FIG. 16A. In this case, however, as shown in FIG. 16B, the rounding of the bent portion of the transferred interconnection pattern 70' cannot be completely suppressed.

Then, in the method for fabricating the semiconductor device according to the present embodiment, when a hole pattern is present at the corner of an interconnection pattern, the hole pattern is doubly exposed to the photoresist film with the interconnection pattern exposed to.

Then, the method for fabricating the semiconductor device according to the present embodiment will be explained specifically by means of an example in which the exposure mask having the mask patterns shown in FIGS. 17 to 20.

The mask pattern shown in FIG. 17 has an interconnection pattern 60 including a part extended in the X-direction and a part extended in the Y-direction and bent at a right angle. The interconnection pattern 60 is a pattern for forming the so-called damascene interconnection and is to be a punched pattern on the mask. That is, in FIG. 17, the region shaded with the slant lines is the transmission region, and the white region is the shade region (including the semi-transmission region of the half-tone mask). In the method for fabricating the semiconductor device according to the first embodiment, the mask pattern shown in FIG. 17 can be used as the mask pattern for forming the interconnection trenches 22 formed in, e.g., the inter-layer insulating film 12 and the etching stopper film 14.

The mask pattern shown in FIG. 18 is for forming hole patterns to be connected to the interconnection pattern 60 and includes a hole pattern 62a to be connected to the part of the interconnection pattern 60 extended in the X-direction and a hole pattern 62b to be connected to the bent portion of the interconnection pattern 60. The hole patterns 62a, 62b are punched patterns on the mask. That is, in FIG. 18, the regions shaded with the slat lines are transmission regions, and the white region is the shade region (including the semi-transmission region of the half-tone mask). The mask pattern shown in FIG. 18 can be used as the mask pattern for forming the contact holes 36 formed in, e.g., the inter-layer insulating film 26 and the etching stopper film 28 in the method for fabricating the semiconductor device according to the fist embodiment.

Figure 19:
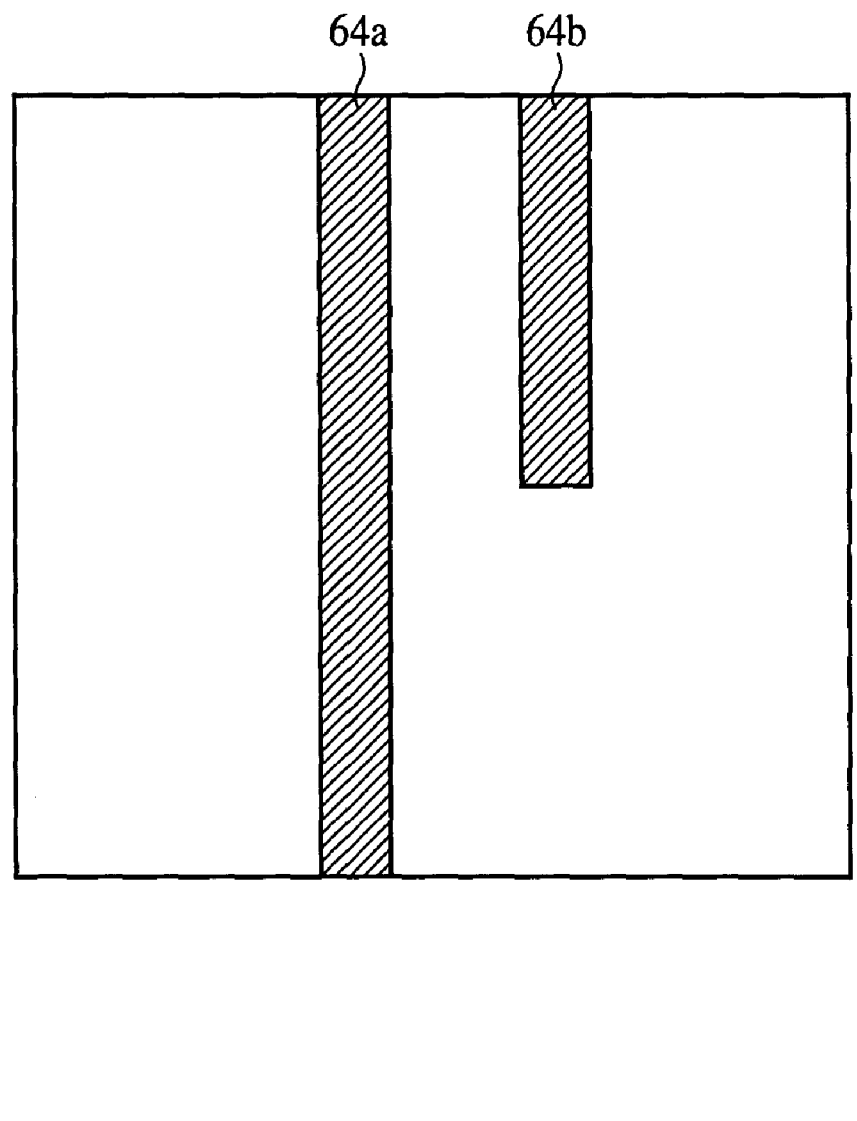

The mask pattern shown in FIG. 19 is for forming interconnection patterns to be connected to the hole patterns 62a, 62b and includes an interconnection pattern 64a extended in the Y-direction and to be connected to the hole pattern 62a, and an interconnection pattern 64b extended in the Y-direction and to be connected to the hole pattern 62b. The interconnection patterns 64a, 64b are patterns for forming the so-called damascene interconnections and to be punched patterns on the mask. That is, in FIG. 19, the regions shaded with the slant lines are the transmission regions, and the white regions are the shade regions (including the semi-transmission regions of the half-tone mask). The mask pattern shown in FIG. 19 can be used as the mask pattern for forming the interconnection trenches 50 formed in, e.g., the inter-layer insulating film 40 and the etching stopper film 42 in the method for fabricating the semiconductor device according to the first embodiment.

The mask pattern shown in FIG. 20 is for the exposure mask which is characteristically used in the method for fabricating the semiconductor device according to the present embodiment, and is a hole patterns, i.e., the hole pattern 62b extracted from the hole patterns 62a, 62b to be formed on the interconnection pattern 60 (see FIG. 18), which is to be positioned at the bent portion of the interconnection pattern 60. Those of hole patterns positioned below the interconnection pattern 60, which are positioned at the bent portion of the interconnection patterns may be added to the mask pattern shown in FIG. 20. Those of hole patterns positioned above or below the interconnection pattern 60, which are positioned at the ends of the interconnection pattern may be added to the mask pattern shown in FIG. 20, as in the first embodiment.

The mask data of the exposure mask for the hole patterns to be doubly exposed can be prepared only by extracting the holes positioned at the bent portions of the interconnection patterns from the mask data for the exposure mask for forming the hole patterns to be connected to the interconnection patterns, which permits the additional exposure mask to be prepared without adding large design works.

The exposure mask for the hole patterns, which is doubly exposed is not essentially of the same kind (e.g., the transmittance of the shade portion) as the exposure mask used in forming other layers, such as interconnection patterns, etc. For example, when a half-tone mask is used as other layers of interconnection patterns, etc., the conventional photomask, which uses chrome in the shade portion, may be used as the exposure mask for the hole pattern, which is doubly exposed. Thus, the cost of the exposure mask can be decreased.

First, in the same way as in the method for fabricating the semiconductor device according to the first embodiment, an inter-layer insulating film 12, an etching stopper film 14, an anti-reflection film 16 and a photoresist film 18 are formed over a substrate 10 (see FIGS. 5A and 5B).

Then, the mask pattern shown in FIG. 17 is exposed to the photoresist film 18 by an exposure system. This mask pattern has the interconnection pattern 60 of, e.g., 100 nm-width. At this time, at the bent portion of the interconnection pattern 60 to be exposed, the exposure energy cannot be sufficient. Accordingly, when the photoresist film 18 in this state is developed, the pattern rounding takes place at the bent portion of the interconnection pattern 60.

Then, in the method for fabricating the semiconductor device according to the present embodiment, the exposure mask having the mask pattern shown in FIG. 20, which is the extracted hole pattern at the bent portion of the interconnection pattern is prepared, and by using this exposure mask, the mask pattern is doubly exposed to the photoresist film 18 with the interconnection pattern exposed to.

The hole pattern is doubly exposed to the photoresist film 18 with the interconnection pattern exposed to, whereby the exposure energy can be sufficient also at the bent portion of the interconnection pattern, where the exposure energy has not been sufficient, which can prevent the rounding of the bent portion of the interconnection pattern.

The range where the pattern rounding takes place due to the optical proximity effect is generally within twice a pattern width from the bent portion of the interconnection pattern. Accordingly, the hole pattern to be doubly exposed is extracted preferably from hole patterns positioned within twice a pattern width from the end of the interconnection pattern.

Then, the photoresist film 18 having the interconnection pattern and the hole pattern doubly exposed is developed, and openings 20 corresponding to the interconnection pattern 60 are formed in the photoresist film 18.

Then, in the same way as in the method for fabricating the semiconductor device according to the first embodiment, an interconnection layer 24 buried in the inter-layer insulating film 12 and the etching stopper film 14, an inter-layer insulating film 26 and an etching stopper film 28 are formed, (see FIGS. 6C to 8A).

Then, in the same way as in the method for fabricating the semiconductor device according to the first embodiment, an anti-reflection film 30 and a photoresist film 32 are formed on the etching stopper film 28.

Next, the mask pattern shown in FIG. 18 is exposed to the photoresist film 32 by the exposure system. This mask pattern has the hole patterns 62a, 62b of, e.g., a 100 nm-hole diameter.

Next, the photoresist film 32 with the hole patterns exposed to is developed, and openings 34 corresponding to the hole patterns 62a, 62b are formed in the photoresist film 32.

Next, in the same way as in the method for fabricating the semiconductor device according to the first embodiment, contact holes 36 are formed in the inter-layer insulating film 26 and the etching stopper film 28 (see FIGS. 8B and 8C). At this time, the pattern rounding is suppressed at the bent portion of the interconnection pattern 60 of the interconnection layer 24, which permits the contact holes 36 to be surely opened over the interconnection layer 24.

Then, in the same way as in the method for fabricating the semiconductor device according to the first embodiment, the contact plugs 38 buried in the inter-layer insulating film 26 and the etching stopper film 28, an inter-layer insulating film 40 and an etching stopper film 42 are formed (see FIGS. 9A and 9B).

Next, in the same way as in the method for fabricating the semiconductor device according to the first embodiment, an anti-reflection film 44 and a photoresist film 46 are formed on the etching stopper film 42.

Next, in the same way as in the method for fabricating the semiconductor device according to the first embodiment, the mask pattern having the interconnection patterns 64a, 64b as shown in FIG. 19, and the mask pattern (not shown) having hole patterns which are to be connected to the bent portions and the ends of the interconnection patterns 64a, 64b as required are exposed to the photoresist film 46 (see FIGS. 9A to 10A). The width of the interconnection patterns 64a, 64b is, e.g., 100 nm. Thus, the pattern rounding at the bent portions of the interconnections, where hole patterns must be formed, can be prevented.

Then, in the same way as in the method for fabricating the semiconductor device according to the first embodiment, interconnection layers 52 buried in the inter-layer insulating film 40 and the etching stopper film 42 are formed (see FIG. 10B).

Then, interconnection layers, etc. are further formed as required, and the semiconductor device is completed.

As described above, according to the present embodiment, in the photography step of forming the interconnection pattern, the interconnection pattern, and the hole pattern to be connected to the bent portion of the interconnection pattern are doubly exposed, whereby the insufficiency of the exposure energy at the bent portion of the pattern due to the optical proximity effect can be compensated. Thus, the rounding at the pattern bent portion can be prevented, and the contact with the contact plugs to be connected to the pattern bent portion can be ensured.

The mask data of the exposure mask to be used in the double exposure can be prepared only by extracting holes positioned at the bent portions of the interconnection patterns from the mask data of the exposure mask for forming the hole patterns, which allows the additional exposure mask to be prepared without adding large design works.

A Third Embodiment

The method for fabricating the semiconductor device according to a third embodiment of the present invention will be explained with reference to FIGS. 21A and 22C. The same members of the present embodiment as those of the exposure mask and the method for fabricating the semiconductor device according to the first and the second embodiment are represented by the same reference numbers not to repeat or to simplify their explanation.

FIGS. 21A to 22C are sectional views showing the steps of the method for fabricating the semiconductor device according to the present embodiment.

In the first and the second embodiments, the present invention is applied to the damascene process. In the present embodiment, the present invention is applied to the conventional interconnection forming process of depositing and patterning a conductive film to thereby form interconnections.

First, a polycrystalline silicon film, for example, is deposited over a substrate 10 by, e.g., CVD method to form a conductive film 80 of the polycrystalline silicon film.

Then, a silicon oxide film, for example, is deposited on the conductive film 80 by, e.g., CVD method to form a hard mask 82 of the silicon oxide film.

Figure 21A:
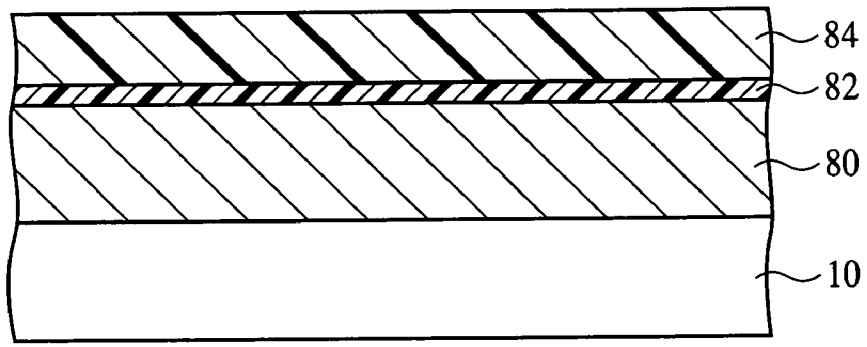
FIGS. 21A-21C and 22A-22C are sectional views showing the steps of the method for fabricating the semiconductor device according to a third embodiment of the present invention.

Then, a negative-type photoresist film 84 is formed on the hard mask 82 by, e.g., spin coating method (FIG. 21A).

Figure 21B:
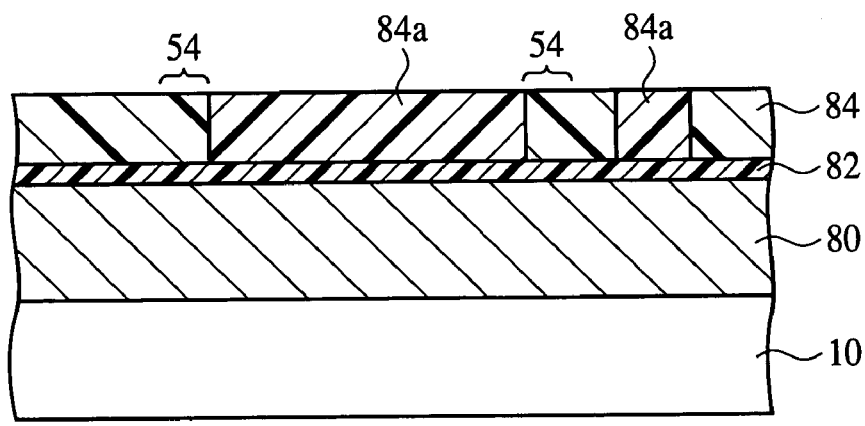

Next, the mask pattern as shown in FIG. 2 is exposed to the photoresist film 84 by an exposure system. The mask pattern has interconnection patterns 60a-60e of, e.g., a 100 nm-width. Thus, latent images 84a reflecting the mask pattern are formed in the exposed regions of the photoresist film 84 (FIG. 21B).

At this time, in the end regions 54 of the exposed interconnection patterns 60a-60e, the exposure energy is insufficient due to the optical proximity effect, and the latent images 84a are not formed. Accordingly, when the photoresist film 84 in this state is developed, the shortening takes place at the ends of the interconnection patterns 60a-60e.

Then, in the method for fabricating the semiconductor device according to the present embodiment, the exposure mask having the mask pattern as shown in FIG. 11 is prepared and doubly exposed to the photoresist film 84 with the interconnection patterns exposed to.

The mask pattern shown in FIG. 11 has hole patterns, i.e., the hole patterns 62b-62i extracted from the hole patterns 62a-62i to be formed on the interconnection patterns 60a-60e (see FIG. 3), which are positioned at the end regions 54 of the interconnection patterns 60a-60e.

Figure 21C:
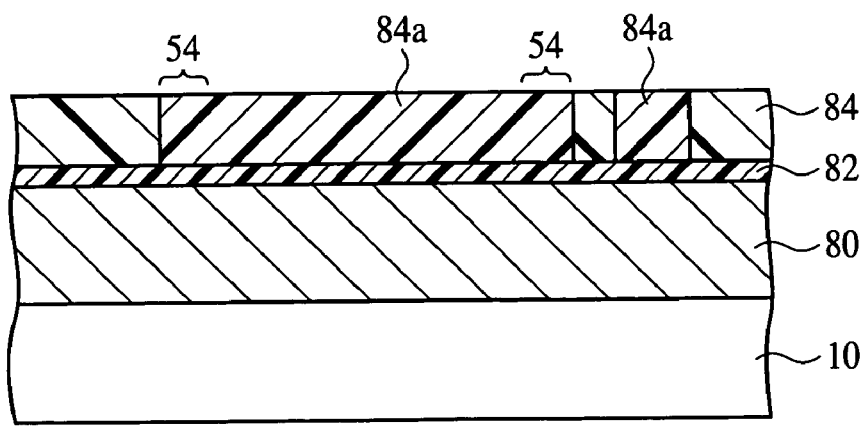

The hole patterns are doubly exposed to the photoresist film 84 with the interconnection patterns exposed to, whereby the exposure energy can be sufficient in the end regions 54 of the interconnection patterns, where the exposure energy has not been sufficient, and the latent images 84a are formed up to the end regions 54 of the interconnection patterns (FIG. 21C). Thus, the shortening can be prevented in the ends of the interconnection patterns 60b-60e, where the hole patterns must be formed thereon.

The exposure mask, which is doubly exposed, has the mask pattern of the hole patterns alone which are positioned at the end regions 54 of the interconnection patterns. Accordingly, the exposure mask can be doubly exposed selectively to the end regions 54 of the interconnection patterns, where the exposure energy is insufficient, and in hole pattern-to-be-formed regions at the centers, etc. of the interconnection patterns, the exposure energy can be prevented from becoming excessive.

Conditions for exposing the hole patterns to be doubly exposed are preferably adjusted suitably corresponding to a size of the shortening due to the optical proximity effect. In addition to the exposure conditions of the exposure system, a parameter for controlling the exposure energy in the pattern end regions 54 can be the size of the hole patterns. One of these parameters may be changed, or both may be changed.

The range where the shortening takes place due to the optical proximity effect is within twice a pattern width from the end of the interconnection pattern. Accordingly, the hole patterns to be doubly exposed are preferably extracted the hole patterns positioned within twice a pattern width from the ends of the interconnection patterns.

Then, the photoresist film 84 having the interconnection patterns and the hole patterns doubly exposed is developed, and the parts of the latent images 84a are left, the rest being removed. Thus, the interconnection patterns 60a'-60e' as shown in FIG. 12 are transferred to the photoresist film 84.

Figure 22A:
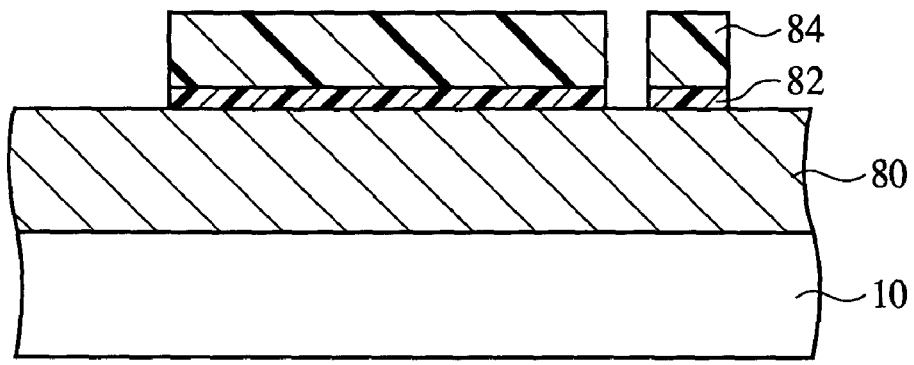

Next, with the photoresist film 84 as the mask, the hard mask 82 is dry etched, and the interconnection patterns 60a'-60e' are transferred to the hard mask 82 (FIG. 22A).

Figure 22B:
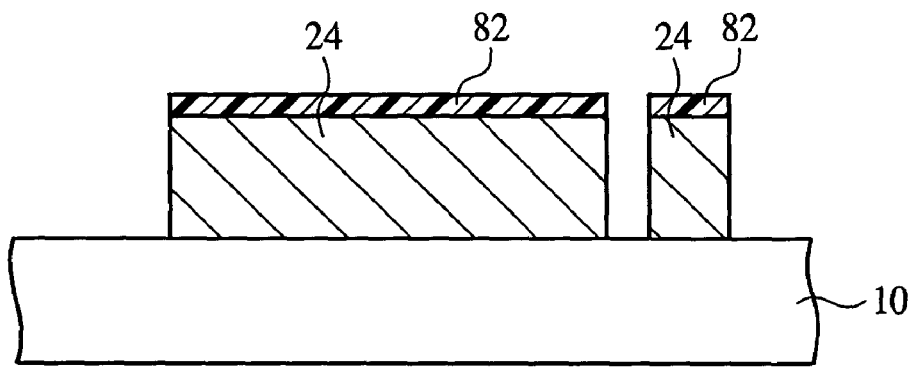
Figure 22C:
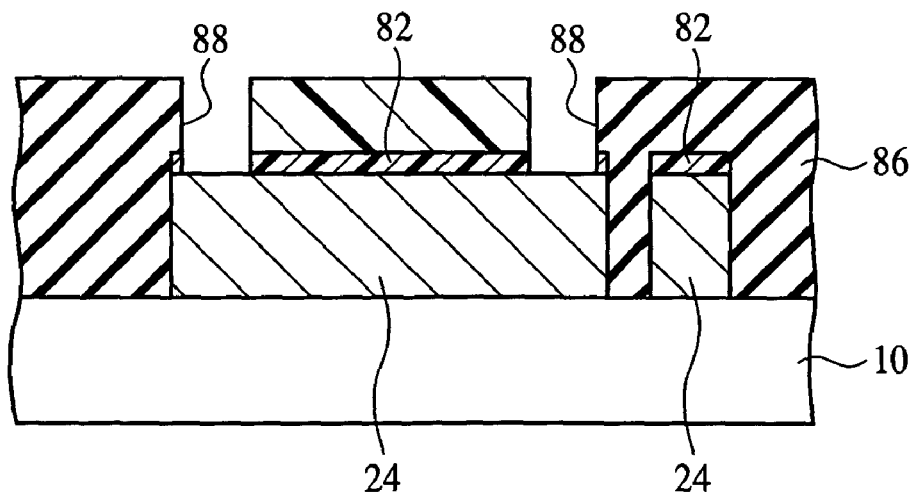
Figure 23A:
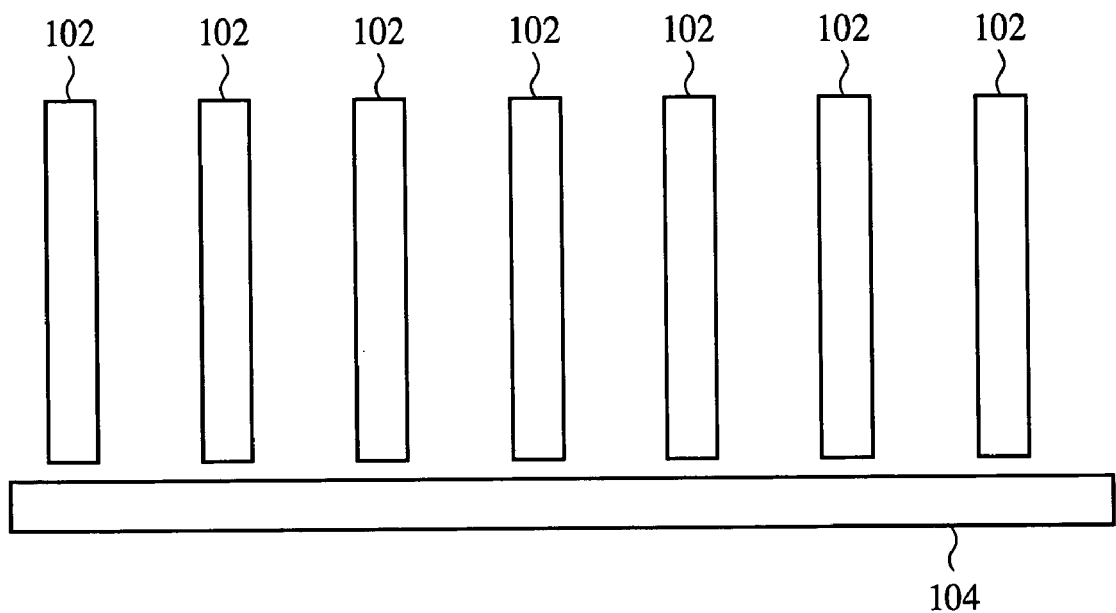
FIGS. 23A and 23B are views showing the shortening of the transferred patterns due to the optical proximity effect.
Figure 23B:
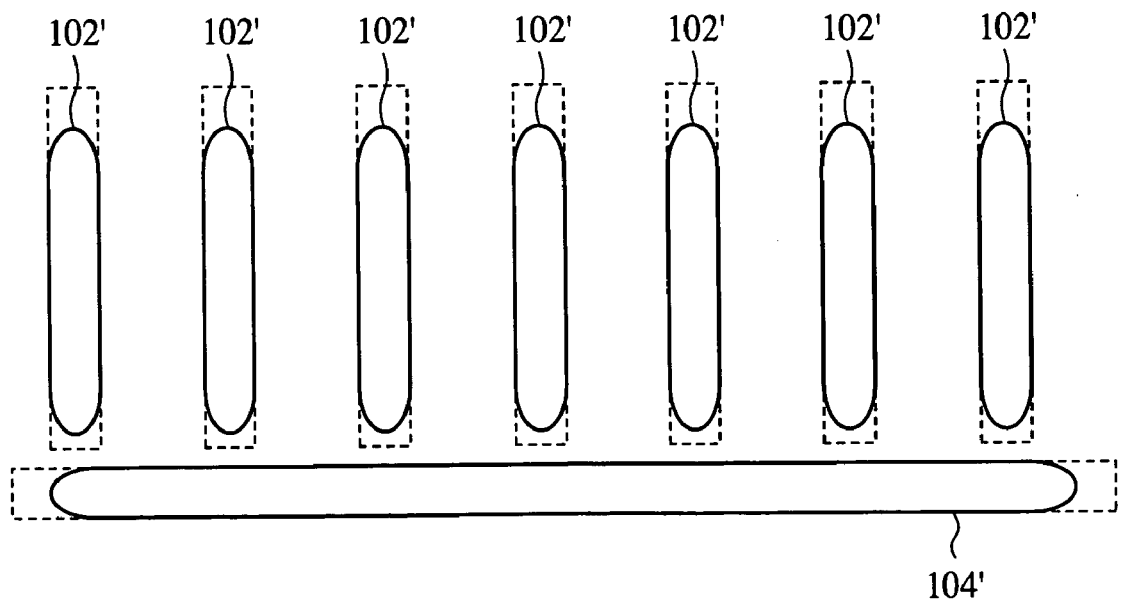
Figure 24A:
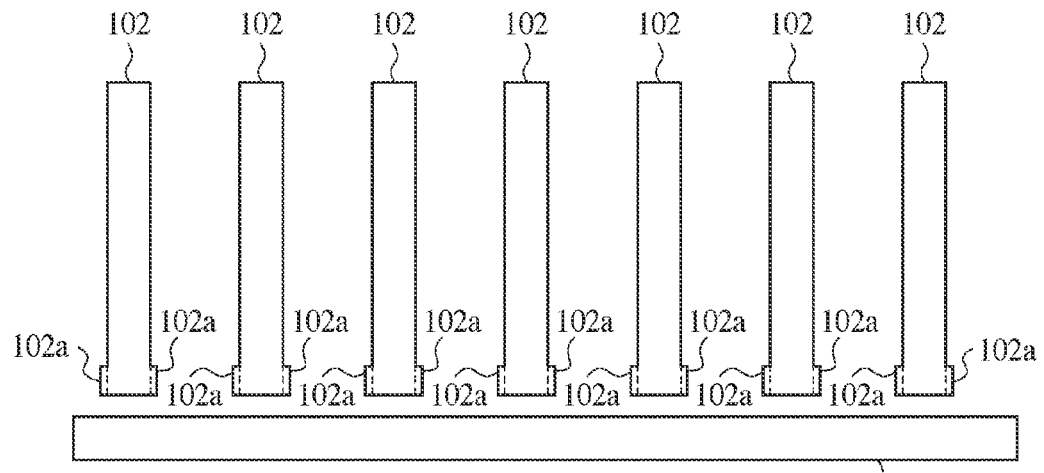
FIGS. 24A-24C are views showing the conventional method for correcting the patterns of the exposure mask.
Figure 24B:
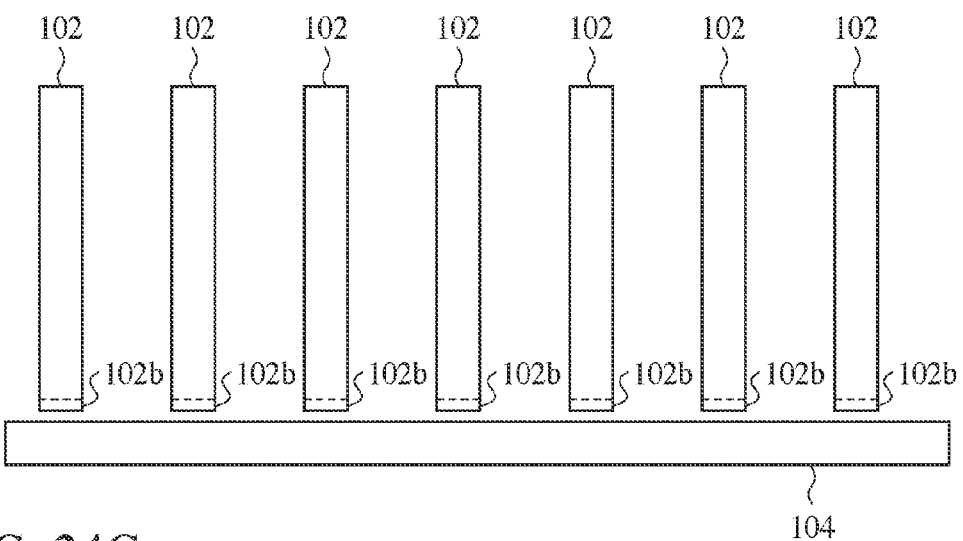
Figure 24C:
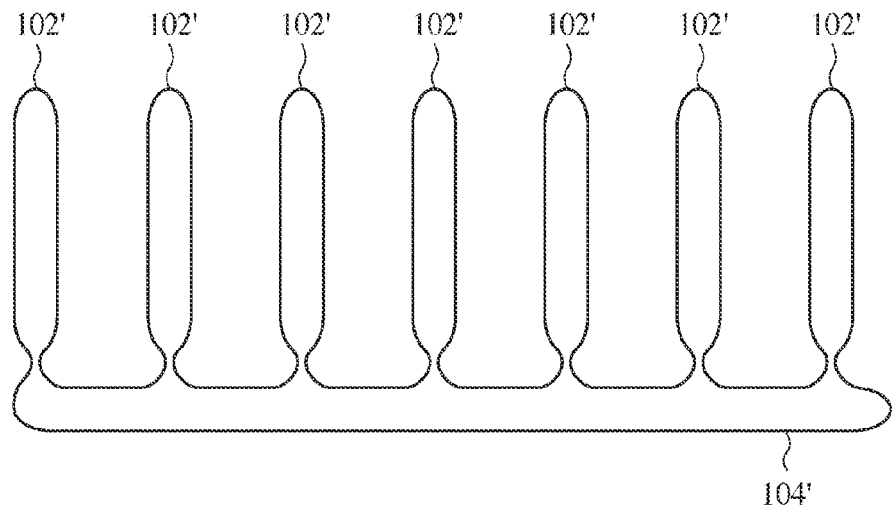

Next, with the patterned hard mask 82 as the mask the conductive film 80 is patterned to form the interconnection layer 24 of the conductive film 80 (FIG. 22B).

Next, on the substrate 10 with the interconnection layer 24 formed on, an insulating film of, e.g., silicon oxide film or others is deposited by, e.g., CVD method to form an inter-layer insulating film 86.

Then, by lithography and dry etching, contact holes 88 are formed in the inter-layer insulating film 86 and the hard mask 82 down to the interconnection layer 24. Hereafter, in the same way as in, e.g., the method for fabricating the semiconductor device according to the first embodiment shown in FIGS. 9A to 10B, the semiconductor device is completed.

As described above, according to the present embodiment, in the photography step of forming the interconnection patterns, the interconnection patterns, and the hole patterns to be connected to the ends of the interconnection patterns are doubly exposed, whereby the insufficiency of the exposure energy at the ends of the patterns due to the optical proximity effect can be compensated. Thus, the shortening at the pattern ends can be prevented, and the contact with the contact plugs to be connected to the pattern ends can be ensured.

The mask data of the exposure mask to be used in the double exposure can be prepared only by extracting holes positioned at the ends of the interconnection patterns from the mask data of the exposure mask for forming the hole patterns, which allows the additional exposure mask to be prepared without adding large design works.

In the present embodiment, in the conventional interconnection forming process of depositing and patterning a conductive film to thereby form an interconnection, the shortening is prevented in the pattern ends as described above in the first embodiment. However, the present embodiment is applicable to the prevention of the rounding of the pattern bent portion as described in the second embodiment.

Modified Embodiments

The present invention is not limited to the above-described embodiments and can cover other various modifications.

For example, in the above-described embodiments, the interconnection patterns to which the OPC has not been made, and the hole patterns are doubly exposed to each other to thereby suppress the shortening at the ends of the interconnection patterns and the rounding of the bent portion of the interconnection patterns due to the optical proximity effect. However, the interconnection patterns to which the OPC has been made, and hole patterns may be doubly exposed.

It is not necessary to apply the present invention to all the ends and bent portion of the interconnection patterns, where hole patterns are overlapped, and the present invention may be applied selectively to regions where the optical proximity effect is especially serious. Regions where the optical proximity effect is reduced by the OPC, and regions where the optical proximity effect is reduced by the present invention may be both provided.

When the shortening at the ends of interconnection patterns and the rounding of the bent portions of the interconnection patterns are simultaneously prevented, it not essentially necessary that the size of hole patterns doubly exposed to the ends of the interconnection patterns, and the size of hole patterns doubly exposed to the bent portions of the interconnection patterns are equal to each other. The size of the hole patterns doubly exposed can be respectively optimized in consideration of a degree of the optical proximity effect taking place in the ends of interconnection patterns and a degree of the optical proximity effect taking place at the bent portions of the interconnection patterns.

In the above-described embodiments, the hole patterns are exposed after the interconnection patterns have been exposed.

However, the interconnection patterns may be exposed after the hole patterns have been exposed.

In the above-described embodiments, the interconnection layers are formed by the so-called single damascene process. However, the present invention is applicable to the case where the interconnection layers are formed by the so-called dual damascene process.

The semiconductor device described in the above-described embodiments is only one example the present invention is applicable to and is not essential. For example, the plane layout and the sizes of the respective layers, the constituent materials, etc. can be suitably selected in accordance with required characteristics, generations of devices, etc.

What is claimed is:

1. A method of manufacturing a semiconductor device comprising:
    forming a first insulating film over a substrate;
    forming a first photoresist film over the first insulating film;
    exposing to the first photoresist film a first mask pattern having an interconnection pattern;
    exposing to the first photoresist film a second mask pattern having a hole positioned at an end or a bent portion of the interconnection pattern where a hole to be connected to the interconnection pattern is to be formed;
    developing the first photoresist film which has been exposed to the first mask pattern and the second mask pattern;
    etching the first insulating film with the first photoresist film as a mask to form an interconnection trench having the interconnection pattern;
    burying a conductive film in the interconnection trench to form an interconnection layer having the interconnection pattern;
    forming a second insulating film over the substrate with the interconnection layer formed on;
    forming a second photoresist film on the second insulating film;
    exposing to the second photoresist film a third mask pattern having a plurality of holes to be connected to the interconnection pattern;
    developing the second photoresist film which has been exposed to the third mask pattern;
    etching the second insulating film with the second photoresist film as a mask to form contact holes in the second insulating film; and
    burying a conductive film in the contact holes to form contact plugs connected to the interconnection layer, wherein
    pattern data of the second mask pattern are given by extracting a hole positioned at the end or the bent portion of the interconnection pattern of the first mask pattern, from a pattern data of the third mask pattern.

2. A method of manufacturing a semiconductor device comprising:
    forming a conductive film over a substrate;
    forming a first photoresist film over the conductive film;
    exposing to the first photoresist film a first mask pattern having an interconnection pattern;
    exposing to the first photoresist film a second mask pattern having a hole positioned at an end or a bent portion of the interconnection pattern where a hole to be connected to the interconnection pattern is to be formed;
    developing the first photoresist film which has been exposed to the first mask pattern and the second mask pattern;
    patterning the conductive film with the first photoresist film as a mask to form an interconnection layer having the interconnection pattern;
    forming a second insulating film over the substrate with the interconnection layer formed on;
    forming a second photoresist film on the second insulating film;
    exposing to the second photoresist film a third mask pattern having a plurality of holes to be connected to the interconnection pattern;
    developing the second photoresist film which has been exposed to the third mask pattern;
    etching the second insulating film with the second photoresist film as a mask to form contact holes in the second insulating film; and
    burying a conductive film in the contact holes to form contact plugs connected to the interconnection layer, wherein
    pattern data of the second mask pattern are given by extracting a hole positioned at the end or the bent portion of the interconnection pattern of the first mask pattern, from a pattern data of the third mask pattern.

3. The method of manufacturing a semiconductor device according to claim 1, wherein
    the first mask pattern includes the hole positioned in a region which is within twice a pattern width of the interconnection pattern from the end or the bent portion of the interconnection pattern.

4. The method of manufacturing a semiconductor device according to claim 1, wherein
    an exposure energy for the second mask patterns is controlled, or a hole diameter of the second mask pattern is set so that pattern deformations of the end or the bent portion of the interconnection pattern due to an optical proximity effect caused when the first mask pattern is exposed are corrected.

5. The method of manufacturing a semiconductor device according to claim 2, wherein
    the first mask pattern includes the hole positioned in a region which is within twice a pattern width of the interconnection pattern from the end or the bent portion of the interconnection pattern.

6. The method of manufacturing a semiconductor device according to claim 2, wherein
    an exposure energy for the second mask patterns is controlled, or a hole diameter of the second mask pattern is set so that pattern deformations of the end or the bent portion of the interconnection pattern due to an optical proximity effect caused when the first mask pattern is exposed are corrected.

7. A method of manufacturing a semiconductor device comprising:
    forming a first insulating film over a substrate;
    forming a first photoresist film over the first insulating film;
    exposing to the first photoresist film a first mask pattern having an interconnection pattern;
    exposing to the first photoresist film a second mask pattern having a hole positioned at an end or a bent portion of the interconnection pattern where a hole to be connected to the interconnection pattern is to be formed;
    developing the first photoresist film which has been exposed to the first mask pattern and the second mask pattern;
    etching the first insulating film with the first photoresist film as a mask to form an interconnection trench having the interconnection pattern;

burying a conductive film in the interconnection trench to form an interconnection layer having the interconnection pattern;

forming a second insulating film over the substrate with the interconnection layer formed on;

forming a second photoresist film on the second insulating film;

exposing to the second photoresist film a third mask pattern having a plurality of holes to be connected to the interconnection pattern;

developing the second photoresist film which has been exposed to the third mask pattern;

etching the second insulating film with the second photoresist film as a mask to form a contact hole in the second insulating film; and burying a conductive film in the contact hole to form a contact plug formed on the end or the bent portion of the interconnection layer.

\* \* \* \* \*